(12) United States Patent
Kang

(10) Patent No.: US 7,936,613 B2
(45) Date of Patent: May 3, 2011

(54) SEMICONDUCTOR MEMORY DEVICE

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 175 days.

(21) Appl. No.: 12/210,927

(22) Filed: Sep. 15, 2008

(65) Prior Publication Data

US 2009/0185432 A1 Jul. 23, 2009

(30) Foreign Application Priority Data

Sep. 17, 2007 (KR) ........................ 10-2007-0094044

(51) Int. Cl.
*G11C 7/06* (2006.01)

(52) U.S. Cl. .......... 365/189.07; 365/189.08; 365/230.03

(58) Field of Classification Search ............. 365/189.07, 365/189.08, 230.03

See application file for complete search history.

(56) References Cited

U.S. PATENT DOCUMENTS

| | | | | |
|---|---|---|---|---|
| 6,314,028 B1 * | 11/2001 | Kono | ........................ | 365/189.09 |
| 6,333,670 B1 * | 12/2001 | Kono et al. | .................... | 327/541 |
| 6,373,753 B1 | 4/2002 | Proebsting | | |
| 7,038,957 B2 | 5/2006 | Kwack et al. | | |
| 7,158,430 B2 * | 1/2007 | Byun et al. | | |
| 7,447,100 B2 * | 11/2008 | Jang | .............................. | 365/226 |
| 7,613,059 B2 * | 11/2009 | Kang | .............................. | 365/207 |
| 2004/0239409 A1 | 12/2004 | Jang et al. | | |
| 2006/0267630 A1 | 11/2006 | Matsui | | |

FOREIGN PATENT DOCUMENTS

| | | |
|---|---|---|
| JP | 11-273346 | 10/1999 |
| JP | 2003-030985 | 1/2003 |
| JP | 2005-318034 | 11/2005 |
| JP | 2006-286163 | 10/2006 |
| JP | 2006-309916 | 11/2006 |
| KR | 100652796 B1 | 11/2006 |
| KR | 1020070049925 A | 5/2007 |
| KR | 1020070056661 A | 6/2007 |

\* cited by examiner

*Primary Examiner* — Pho M Luu

(74) *Attorney, Agent, or Firm* — IP & T Group LLP

(57) ABSTRACT

A charge driving circuit and a discharge driving circuit occupy a relatively small area and maintain driving force in a semiconductor memory device having a plurality of banks. The semiconductor memory device includes multiple banks, a common discharge level detector configured to detect a voltage level of internal voltage terminals on the basis of a first target level in response to active signals corresponding to the respective banks, and a discharge drivers assigned to the respective banks. The discharge drivers are configured to drive the internal voltage terminals to be discharged in response to the respective active signals and respective discharge control signals outputted from the common discharge level detector.

46 Claims, 9 Drawing Sheets

SEMICONDUCTOR MEMORY DEVICE

CROSS-REFERENCE TO RELATED APPLICATION

The present invention claims priority of Korean patent application number 10-2007-0094044, filed on Sep. 17, 2007, which is incorporated by reference in its entirety.

BACKGROUND OF THE INVENTION

The present invention relates to semiconductor design technology, and more particularly to a semiconductor memory device including a charge driving circuit configured to charge an internal voltage and a discharge driving circuit configured to discharge the internal voltage.

As the line width and cell size in a semiconductor memory chip are gradually scaled down, the semiconductor memory chip is designed to operate with a lower power supply voltage. Thus, there is a demand for a design technology satisfying performance required in a low-voltage environment.

In most of semiconductor memory chips, an internal voltage generator for receiving an external power supply voltage (VDD) to generate an internal voltage is built in a chip. Therefore, the internal voltage generator generates a voltage for operation of an internal circuit of the chip.

A memory device such as a dynamic random access memory (DRAM), which utilizes a bit line sense amplifier, uses a core voltage (VCORE) to detect a cell data.

When a word line selected by a row address is enabled, data of a plurality of memory cells connected to the selected word line are transferred to bit lines, and bit line sense amplifiers sense and amplify voltage difference of bit line pairs.

Generally, several thousands of bit line sense amplifiers are operated at the same time. Thus, a large amount of current is consumed at a time at a core voltage terminal, which is used in driving a pull-up power line of the bit line sense amplifier, called RTO.

However, in the trend of lower operating voltage, there is a limitation in amplifying data of a large number of memory cells at a time in a short time by using the core voltage (VCORE).

To solve this problem, a bit line sense amplifier overdriving scheme was adopted. In an initial operation of the bit line sense amplifier, that is, immediately after a charge sharing between a memory cell and a bit line, a voltage line RTO of the bit line sense amplifier is driven by an overdriving voltage (generally, a power supply voltage (VDD)) higher than a core voltage (VCORE) for a predetermined time.

When the power supply voltage (VDD) inputted from the outside is used as the overdriving voltage, a great amount of cell data can be stably amplified at a time in a short time using current of which amount is sufficiently secured.

However, it takes a long time to return to a target level of the core voltage because a level of the power supply voltage is relatively higher than the target level of the core voltage. That is, there is a problem in that the voltage level cannot immediately return to the target level of the core voltage even after finishing overdriving operation.

To rapidly drop the level of the core voltage (VCORE), which is increased by overdriving operation, to the target level, a discharge driving method has been proposed where the core voltage terminal is immediately discharged to become the target level of the core voltage (VCORE) after the overdriving operation.

FIG. 1 is a block diagram of a semiconductor memory device adopting a conventional discharge driving method.

Referring to FIG. 1, the semiconductor memory device adopting the conventional discharge driving method includes a plurality of banks BANK1, BANK2, BANK3 and BANK4, an overdriving pulse generators 190, a plurality of discharge level detectors 100A, 100B, 100C and 100D, a plurality of discharge drivers 110A, 110B, 110C and 110D, a plurality of charge level detectors 130A, 130B, 130C and 130D, and a plurality of charge drivers 140A, 140B, 140C and 140D.

The banks BANK1, BANK2, BANK3 and BANK4 receive a core voltage VCORE to perform a predetermined operation. The overdriving pulse generator 190 generates a overdriving pulses OVER_PUL1, OVER_PUL2, OVER_PUL3 and OVER_PUL4 so as to control overdriving operation of each of the banks BANK1, BANK2, BANK3 and BANK4 in response to respective active signals ACT1, ACT2, ACT3 and ACT4 corresponding to the banks BANK1, BANK2, BANK3 and BANK4. The discharge level detectors 100A, 100B, 100C and 100D are respectively assigned to the banks BANK1, BANK2, BANK3 and BANK4, and detect a level of the core voltage VCORE on the basis of a first target level when one of the overdriving pulses OVER_PUL1, OVER_PUL2 OVER_PUL3 and OVER_PUL4 is activated. The discharge drivers 110A, 110B, 110C and 110D are respectively assigned to the banks BANK1, BANK2, BANK3 and BANK4, and drive a core voltage terminal to be discharged in response to respective discharge control signals DISCH_CON1 DISCH_CON2, DISCH_CON3 and DISCH_CON4 outputted from the discharge level detectors 100A, 100B, 100C and 100D. The charge level detectors 130A, 130B, 130C and 130D are respectively assigned to the banks BANK1, BANK2, BANK3 and BANK4, and detect a level of the core voltage VCORE on the basis of a second target level when one of the active signals ACT1, ACT2, ACT3 and ACT4 corresponding to the banks BANK1, BANK2, BANK3 and BANK4 is activated. The charge drivers 140A, 140B, 140C and 140D are respectively assigned to the banks BANK1, BANK2, BANK3 and BANK4, and drive the core voltage terminal to be charged in response to respective charge control signals CH_CON1, CH_CON2, CH_CON3 and CH_CON4 outputted from the charge level detectors 130A, 130B, 130C and 130D.

In addition, the semiconductor memory device adopting the conventional discharge driving method further includes an active signal generator 180 and a reference voltage generator 120. The active signal generator 180 generates the active signals ACT1, ACT2, ACT3 and ACT4 corresponding to each operation of the banks BANK1, BANK2, BANK3 and BANK4, respectively. The reference voltage generator 120 generates and supplies a reference voltage VREF corresponding to the first target level to the discharge level detectors 100A, 100B, 100C and 100D, and also generates and supplies a reference voltage VREF corresponding to the second target level to the charge level detectors 130A, 130B, 130C and 130D.

Although FIG. 1 illustrates that the reference voltage VREF corresponding to the first target level and the reference voltage VREF corresponding to the second target level, which are outputted from the reference voltage generator 120, are equal to each other, they may be different from each other. For example, when the first target level is different from the second target level, a level of the reference voltage VREF corresponding to the first target level used in controlling the discharge drivers 110A, 110B, 110C and 110D in the discharge level detectors 100A, 100B, 100C and 100D is higher than a level of the reference voltage VREF corresponding to the second target level used in controlling the charge drivers 140A, 140B, 140C and 140D in the charge level detectors 130A, 130B, 130C and 130D. That is, the reference voltage generator 120 may generate only one reference voltage VREF commonly used in the discharge level detectors 100A, 100B, 100C and 100D, and the charge level detectors 130A, 130B, 130C and 130D. Alternatively, the reference voltage generator 120 may generate a plurality of reference voltages VREF with different levels so that the discharge level detectors 100A, 100B, 100C and 100D, and the charge level detectors 130A, 130B, 130C and 130D may use the reference voltages VREF, respectively.

Here, the first bank BANK1 includes a first bit line sense amplifier 160A configured to sense and amplify data carried on a bit line, and a first overdriver 170A configured to drive a power line RTO of the first bit line sense amplifier 160A with the core voltage VCORE or the overdriving voltage VDD. Likewise, the second bank BANK2 includes a second bit line sense amplifier 160B configured to sense and amplify data carried on a bit line, and a second overdriver 170B configured to drive a power line RTO of the second bit line sense amplifier 160B with the core voltage VCORE or the overdriving voltage VDD. Also, the third bank BANK3 includes a third bit line sense amplifier 160C and a third overdriver 170C, and the fourth bank BANK4 includes a fourth bit line sense amplifier 160D and a fourth overdriver 170D.

FIG. 2A is a circuit diagram illustrating the discharge level detectors 100A, 100B, 100C and 100D and the discharge drivers 110A, 110B, 110C and 110D in the semiconductor memory device of FIG. 1.

Referring to FIG. 2A, the first discharge level detector 100A includes a first voltage divider 102A configured to divide a voltage level of the core voltage terminal by a predetermined ratio to generate a division voltage DIV_VOL, and a first voltage comparator 104A configured to compare a level of the division voltage DIV_VOL with a level of the reference voltage VREF corresponding to the first target level and to be turned on/off in response to the overdriving pulse OVER_PUL1. The second discharge level detector 100B includes a second voltage divider 102B configured to divide a voltage level of the core voltage terminal by a predetermined ratio to generate a division voltage DIV_VOL, and a second voltage divider 104B configured to compare a level of the division voltage DIV_VOL with a level of the reference voltage VREF corresponding to the first target level and to be turned on/off in response to the overdriving pulse OVER_PUL2. The third discharge level detector 100C includes a third voltage divider 102C configured to divide a voltage level of the core voltage terminal by a predetermined ratio to generate a division voltage DIV_VOL, and a third voltage divider 104C configured to compare a level of the division voltage DIV_VOL with a level of the reference voltage VREF corresponding to the first target level and to be turned on/off in response to the overdriving pulse OVER_PUL3. The fourth discharge level detector 100D includes a fourth voltage divider 102D configured to divide a voltage level of the core voltage terminal by a predetermined ratio to generate a division voltage DIV_VOL, and a fourth voltage divider 104D configured to compare a level of the division voltage DIV_VOL with a level of the reference voltage VREF corresponding to the first target level and to be turned on/off in response to the overdriving pulse OVER_PUL4.

Here, each of the voltage dividers 102A, 102B, 102C and 102D includes first and second resistors R1 and R2 connected in series between the core voltage terminal and a ground voltage terminal, and outputs the division voltage DIV_VOL through a connection node DIN between the first and second resistors R1 and R2.

The first discharge driver 110A includes a first NMOS transistor DN1 provided with a gate receiving the discharge control signal DISCH_CON1 outputted from the voltage comparator 104A, a drain connected to the core voltage terminal, and a source connected to the ground voltage terminal. The second discharge driver 110B includes a second NMOS transistor DN2 provided with a gate receiving the discharge control signal DISCH_CON2 outputted from the voltage comparator 104B, a drain connected to the core voltage terminal, and a source connected to the ground voltage terminal. The third discharge driver 110C includes a third NMOS transistor DN3 provided with a gate receiving the discharge control signal DISCH_CON3 outputted from the voltage comparator 104C, a drain connected to the core voltage terminal, and a source connected to the ground voltage terminal. The fourth discharge driver 110D includes a fourth NMOS transistor DN4 provided with a gate receiving the discharge control signal DISCH_CON4 outputted from the voltage comparator 104D, a drain connected to the core voltage terminal, and a source connected to the ground voltage terminal.

FIG. 2B is a circuit diagram illustrating the charge level detectors 130A, 1130B, 1130C and 130D and the charge drivers 140A, 140B, 140C and 140D in the semiconductor memory device of FIG. 1.

Referring to FIG. 2B, the first charge level detector 130A includes a first voltage divider 132A configured to divide a voltage level of a core voltage terminal by a predetermined ratio to generate a division voltage DIV_VOL, and a first voltage comparator 134A configured to compare the division voltage DIV_VOL with the reference voltage VREF corresponding to the second target level and to be turned on/off in response to the active signal ACT1 inputted as a bias. The second charge level detector 130B includes a second voltage divider 132B configured to divide a voltage level of the core voltage terminal by a predetermined ratio to generate a division voltage DIV_VOL, and a second voltage comparator 134B configured to compare the division voltage DIV_VOL with the reference voltage VREF corresponding to the second target level and to be turned on/off in response to the active signal ACT2 inputted as a bias. The third charge level detector 130C includes a third voltage divider 132C configured to divide a voltage level of the core voltage terminal by a predetermined ratio to generate a division voltage DIV_VOL, and a third voltage comparator 134C configured to compare the division voltage DIV_VOL with the reference voltage VREF corresponding to the second target level and to be turned on/off in response to the active signal ACT3 inputted as a bias. The fourth charge level detector 130D includes a fourth voltage divider 132D configured to divide a voltage level of the core voltage terminal by a predetermined ratio to generate a division voltage DIV_VOL, and a fourth voltage comparator 134D configured to compare the division voltage DIV_VOL with the reference voltage VREF corresponding to the second target level and to be turned on/off in response to the active signal ACT4 inputted as a bias.

Here, each of the voltage dividers 132A, 132B, 132C and 132D includes first and second resistors R1 and R2 connected in series between the core voltage terminal and the ground voltage terminal, and outputs the division voltage DIV_VOL through a connection node DIN between the first and second resistors R1 and R2.

The first charge driver 140A includes a first PMOS transistor DP1 provided with a gate receiving the charge control signal CH_CON1 outputted from the voltage comparator 134A, a source connected to a power supply voltage terminal and a drain connected to the core voltage terminal. The second charge driver 140B includes a second PMOS transistor DP2 provided with a gate receiving the charge control signal CH_CON2 outputted from the voltage comparator 134B, a source connected to the power supply voltage terminal and a drain connected to the core voltage terminal. The third charge driver 140C includes a third PMOS transistor DP3 provided with a gate receiving the charge control signal CH_CON3 outputted from the voltage comparator 134C, a source connected to the power supply voltage terminal and a drain connected to the core voltage terminal. The fourth charge driver 140D includes a fourth PMOS transistor DP4 provided with a gate receiving the charge control signal CH_CON4 outputted from the voltage comparator 134D, a source connected to the power supply voltage terminal and a drain connected to the core voltage terminal.

Operation of the semiconductor memory device adopting the conventional discharge driving method will be described in detail below.

During a period when one of the banks BANK1, BANK2, BANK3 and BANK4 is enabled so that at least one of the active signals ACT1, ACT2, ACT3 and ACT4 is activated, at least one of the charge level detectors 130A, 130B, 130C and 130D operates to detect a voltage level of the core voltage terminal on the basis of the second target level.

When at least one of the charge level detectors 130A, 130B, 130C and 130D detects the voltage level of the core voltage terminal to be lower than the second target level, the voltage level of the core voltage terminal is increased by controlling at least one of the charge drivers 140A, 140B, 140C and 140D to perform a pull-up operation.

On the contrary, when at least one charge level detectors 130A, 130B, 130C and 130D detects the level of the core voltage terminal to be higher than the second target level, the charge drivers 140A, 140B, 140C and 140D are controlled not to perform the pull-up operation until the voltage level of the core voltage VCORE is lower than the second target level through natural discharge or operation of the discharge drivers 110A, 110B, 110C and 110D.

Independently of the operation of the charge level detectors 130A, 130B, 130C and 130D, at least one of the overdriving pulses OVER_PUL1, OVER_PUL2, OVER_PUL3 and OVER_PUL4 is activated in response to at least one activated active signal ACT1, ACT2, ACT3 or ACT4 in the overdriving pulse generator 190. Accordingly, at least one of the banks BANK1, BANK2, BANK3 and BANK4 receiving at least one activated overdriving pulse OVER_PUL1, OVER_PUL2, OVER_PUL3 or OVER_PUL4 performs an overdriving operation. While the overdriving operation is being performed, the voltage level of the core voltage terminal is rapidly increased to the level of the power supply voltage VDD. Resultingly, the voltage level of the core voltage terminal becomes higher than the second target level as well as the first target level.

At this time, the discharge level detectors 100A, 100B, 100C and 100D also receive at least one activated overdriving pulse OVER_PUL1, OVER_PUL2, OVER_PUL3 or OVER_PUL4.

However, if at least one of the discharge level detectors 100A, 100B, 100C and 100D immediately operates in response to at least one of the overdriving pulses OVER_PUL1 OVER_PUL2, OVER_PUL3 and OVER_PUL4 which are inputted thereto, this operation is duplicately performed with the overdriving operation that is being performed in at least one of the banks BANK1, BANK2, BANK3 and BANK4. Consequently, the overdriving operation cannot be normally performed because at least one of the banks BANK1, BANK2, BANK3 and BANK4 tries to increase the voltage level of the core voltage terminal through the overdriving operation but at least one of the discharge level detectors 100A, 100B, 100C and 100D tries to decrease the voltage level of the core voltage terminal by operating the discharge drivers 110A, 110B, 110C and 110D.

Therefore, the discharge level detectors 100A, 100B, 100C and 100D is controlled so as to operate in response to a delay pulse obtained by delaying at least one activated overdriving pulse OVER_PUL1, OVER_PUL2, OVER_PUL3 or OVER_PUL4 by a predetermined time. Consequently, it is possible to control an overdriving point of at least one enabled bank of the banks BANK1, BANK2, BANK3 and BANK4 to differ from an operating point of at least one of the discharge drivers 110A, 110B, 110C and 110D.

In detail, a plurality of pulse delays 106A, 106B, 106C and 106D delay the overdriving pulses OVER_PUL1, OVER_PUL2, OVER_PUL3 and OVER_PUL4 by predetermined times to output a plurality of delay pulses DOVER_PUL1, DOVER_PUL2, DOVER_PUL3 and DOVER_PUL4, respectively. Then, at least one of the discharge level detectors 100A, 100B, 100C and 100D operates in response to the activation of at least one of the delay pulses DOVER_PUL1, DOVER_PUL2, DOVER_PUL3 and DOVER_PUL4, thereby detecting the voltage level of the core voltage terminal on the basis of the first target level.

In this way, at a point of time when at least one of the discharge level detectors 100A, 100B, 100C and 100D detects the voltage level of the core voltage terminal on the basis of the first target level, at least one enabled bank BANK1, BANK2, BANK3 or BANK4 has performed overdriving operation already. Therefore, the voltage level of the core voltage terminal has been increased to be much higher than the first target level. Accordingly, at least one of the discharge level detectors 100A, 100B, 100C and 100D controls at least one of the discharge drivers 110A, 110B, 110C and 110D to be operated to decrease the voltage level of the core voltage terminal.

Of course, in the case where overdriving operation is performed to a voltage level lower than a target level of the power supply voltage VDD because the power supply voltage VDD is a voltage inputted from the outside, the discharge level detectors 100A, 100B, 100C and 100D appropriately control the operation of each of the discharge drivers 110A, 110B, 110C and 110D to thereby prevent the voltage level of the core voltage terminal from being excessively lowered.

As described above, the charge drivers 140A, 140B, 140C and 140D are respectively turned on/off by the charge level detectors 130A, 130B, 130C and 130D corresponding thereto. Likewise, the discharge drivers 110A, 110B, 110C and 110D are respectively turned on/off by the discharge level detectors 100A, 100B, 100C and 100D corresponding thereto. The charge level detectors 130A, 130B, 130C and 130D and the discharge level detectors 100A, 100B, 100C and 100D are controlled according to a voltage level variation of the core voltage terminal, thus maintaining the core voltage terminal to have a stable target level.

Therefore, the charge drivers 140A, 140B, 140C and 140D and the discharge drivers 110A, 110B, 110C and 110D correspond one-to-one to the banks BANK1, BANK2, BANK3 and BANK4, respectively, as shown in FIG. 1. Similarly, the charge level detectors 130A, 130B, 130C and 130D and the discharge level detectors 100A, 100B, 100C and 100D correspond one-to-one to the banks BANK1, BANK2, BANK3 and BANK4, respectively.

However, the charge drivers 140A, 140B, 140C and 140D and the discharge drivers 110A, 110B, 110C and 110D, the charge level detectors 130A, 130B, 130C and 130D and the discharge level detectors 100A, 100B, 100C and 100D, and the banks BANK1, BANK2, BANK3 and BANK4 are all connected to one core voltage terminal, as illustrated in FIG. 1.

That is, the charge drivers 140A, 140B, 140C and 140D and the discharge drivers 110A, 110B, 110C and 110D, and the charge level detectors 130A, 130B, 130C and 130D and the discharge level detectors 100A, 100B, 100C and 100D are respectively connected to the core voltage terminal which is relatively close to the corresponding banks BANK1, BANK2, BANK3 and BANK4.

For example, the charge and discharge drivers 140A and 110A, and the second and discharge level detectors 130A and 100A are connected to the core voltage terminal that is relatively close to the bank BANK1, and operate according to the operation of the bank BANK1.

However, such a configuration gives a rise to a problem below. In the case where all the banks BANK1, BANK2, BANK3 and BANK4 operate at the same time although the core voltage terminal is connected to the banks BANK1, BANK2, BANK3 and BANK4, the charge level detectors 130A, 130B, 130C and 130D, and the discharge level detectors 100A, 100B, 100C and 100D are all operated simultaneously to thereby detect the same core voltage VCORE duplicately.

As a result, current that should not be used actually is undesirably consumed.

Each of the charge level detectors 130A, 130B, 130C and 130D includes a comparator configured to compare the level of the core voltage VCORE with the second target level, and also includes a resistor configured to divide the level of the core voltage VCORE to increase operating efficiency of the comparator.

Likewise, each of the discharge level detectors 100A, 100B, 100C and 100D includes a comparator configured to compare the level of the core voltage VCORE with the first target level, and also includes a resistor configured to divide the level of the core voltage VCORE to increase operating efficiency of the comparator.

However, the comparators and resistors occupy a relatively large area in the semiconductor memory device. Therefore, since each of the charge level detectors 130A, 130B, 130C and 130D and each of the discharge level detectors 100A, 100B, 100C and 100D include the comparators and the resistors, a relatively large area is required in the semiconductor memory device, thus leading to an increase in a total area of the semiconductor memory device after all.

SUMMARY OF THE INVENTION

Embodiments of the present invention are directed to providing a charge driving circuit and a discharge driving circuit that occupy a relatively small area and maintain driving force in a semiconductor memory device having a plurality of banks.

In accordance with an aspect of the invention, there is provided a semiconductor memory device, which includes a plurality of banks, a common discharge level detector configured to detect a voltage level of internal voltage terminals on the basis of a first target level in response to active signals corresponding to the respective banks, and a plurality of discharge drivers respectively assigned to the banks, and configured to drive the internal voltage terminals to be discharged in response to the respective active signals and respective discharge control signals outputted from the common discharge level detector.

In accordance with an aspect of the invention, there is provided a semiconductor memory device, which includes a plurality of banks, each including a bit line sense amplifier configured to sense and amplify data carried on a bit line, and a power line driver configured to drive a power line of the bit line sense amplifier with an overdriving voltage or a core voltage inputted through core voltage terminals, an overdriving pulse generator configured to generate a plurality of overdriving pulses for controlling overdriving operation of each of the banks in response to active signals corresponding to each of the banks, a common discharge level detector configured to detect a voltage level of the core voltage terminals on the basis of a first target level in response to the overdriving pulses corresponding to the respective banks, and a plurality of discharge drivers respectively assigned to the banks, and configured to drive the core voltage terminals to be discharged in response to the respective overdriving pulses and respective discharge control signals outputted from the common discharge level detector.

In accordance with an aspect of the invention, there is provided a semiconductor memory device, which includes a plurality of banks, a common discharge level detector configured to detect a voltage level of internal voltage terminals on the basis of a first target level in response to active signals corresponding to the respective banks, a common charge level detector configured to detect a voltage level of the internal voltage terminals on the basis of a second target level in response to the active signals, a plurality of discharge drivers respectively assigned to the banks, and configured to drive the internal voltage terminals to be discharged in response to the respective active signals and respective discharge control signals outputted from the common discharge level detector, and a plurality of charge drivers respectively assigned to the banks, and configured to drive the internal voltage terminals to be charged in response to the respective active signals and respective charge control signals outputted from the common charge level detector.

In accordance with an aspect of the invention, there is provided a semiconductor memory device, which includes a plurality of banks, each including a bit line sense amplifier configured to sense and amplify data carried on a bit line, and a power line driver configured to drive a power line of the bit line sense amplifier with an overdriving voltage or a core voltage inputted through core voltage terminals, an overdriving pulse generator configured to generate a plurality of overdriving pulses for controlling overdriving operation of each of the banks in response to active signals corresponding to each of the banks, a common discharge level detector configured to detect a voltage level of the core voltage terminals on the basis of a first target level in response to the overdriving pulses corresponding to the respective banks, a common charge level detector configured to detect a voltage level of the core voltage terminals on the basis of a second target level in response to the active signals, a plurality of discharge drivers respectively assigned to the banks, and configured to drive the core voltage terminals to be discharged in response to the respective overdriving pulses and respective discharge control signals outputted from the common discharge level detector, and a plurality of charge drivers respectively assigned to the banks, and configured to drive the core voltage terminals to be charged in response to the respective active signals and respective charge control signals outputted from the common charge level detector.

DESCRIPTION OF SPECIFIC EMBODIMENTS

Hereinafter, a semiconductor memory device in accordance with the present invention will be described in detail with reference to the accompanying drawings.

Embodiment 1

Figure 3:
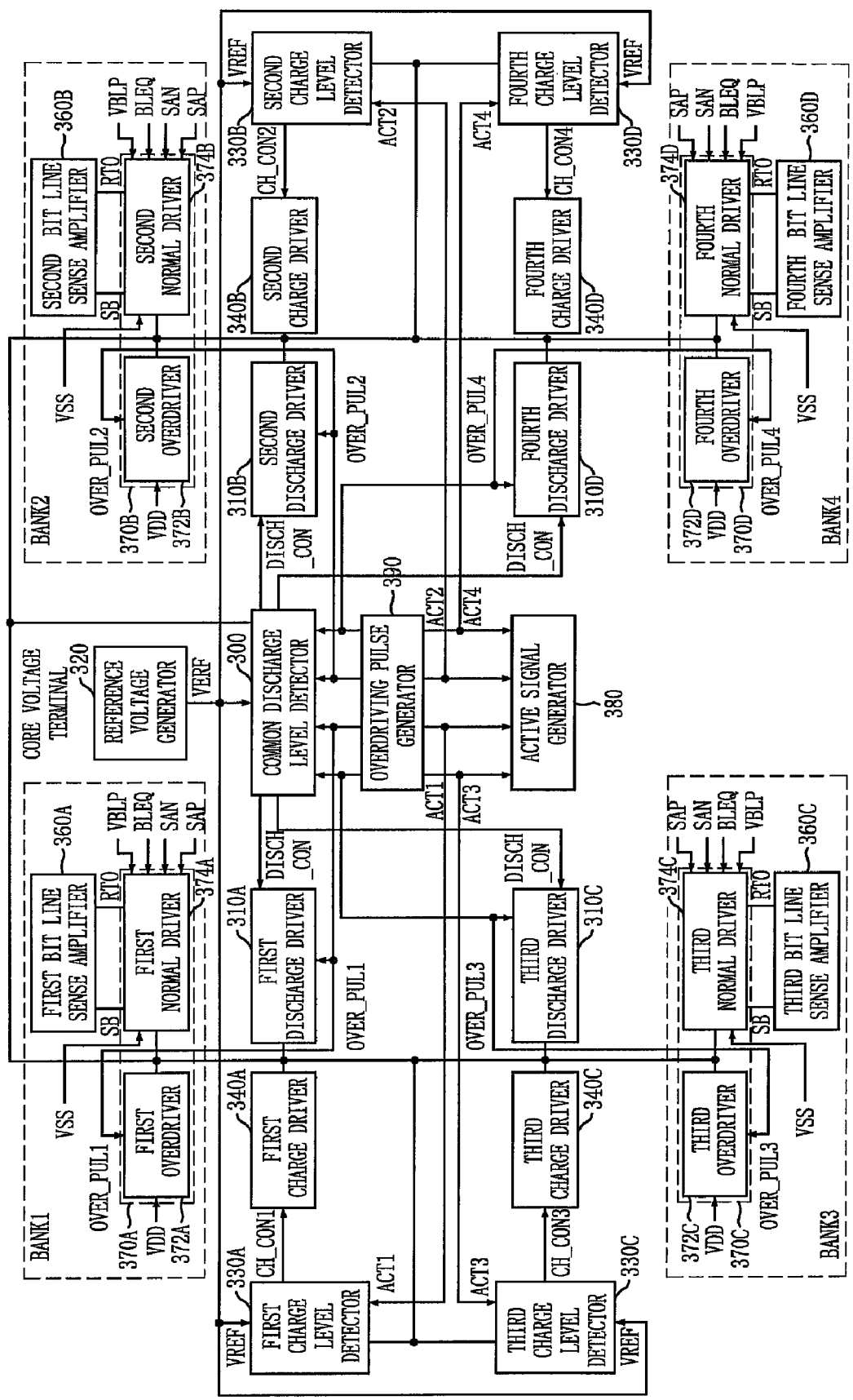
FIG. 3 is a block diagram of a semiconductor memory device adopting a discharge driving method in accordance with a first embodiment of the invention.

FIG. 3 is a block diagram of a semiconductor memory device adopting a discharge driving method in accordance with a first embodiment of the invention.

Referring to FIG. 3, the semiconductor memory device adopting a discharge driving method in accordance with the first embodiment of the invention includes a plurality of banks BANK1, BANK2, BANK3 and BANK4, an overdriving pulse generator 390, a common discharge level detector 300, a plurality of charge drivers 310A, 310B, 310C and 310D, a plurality of charge level detectors 330A, 330B, 330C and 330D, and a plurality of charge drivers 340A, 340B, 340C and 340D.

Each of the plurality of banks BANK1, BANK2, BANK3 and BANK4 includes a bit line sense amplifier and an overdriver. For instance, the first bank BANK1 includes a first bit line sense amplifier 360A configured to sense and amplify data carried on a bit line, and a first overdriver 370A configured to drive a power line RTO of the first bit line sense amplifier 360A with a core voltage VCORE or an overdriving voltage VDD. Similarly, the second bank BANK2 includes a second bit line sense amplifier 360B and a second overdriver 370B, the third bank BANK3 includes a third bit line sense amplifier 360C and a third overdriver 370C, and the fourth bank BANK4 includes a fourth bit line sense amplifier 360D and a fourth overdriver 370D. The overdriving pulse generator 390 generates a plurality of overdriving pulses OVER_PUL1, OVER_PUL2, OVER_PUL3 and OVER_PUL4 so as to control overdriving operation of each of the banks BANK1, BANK2, BANK3 and BANK4 in response to active signals ACT1, ACT2, ACT3 and ACT4 corresponding to the respective banks BANK1, BANK2, BANK3 and BANK4. The common discharge level detector 300 detects a voltage level of a core voltage terminal on the basis of a first target level in response to each of the overdriving pulses OVER_PUL1, OVER_PUL2, OVER_PUL3 and OVER_PUL4. The discharge drivers 310A, 310B, 310C and 310D are respectively assigned to the banks BANK1, BANK2, BANK3 and BANK4, and drive the core voltage terminal to be discharged in response to the respective overdriving pulses OVER_PUL1, OVER_PUL2 OVER_PUL3 and OVER_PUL4 and discharge control signals DISCH_CON outputted from the common discharge level detector 300. The charge level detectors 330A, 330B, 330C and 330D are respectively assigned to the banks BANK1, BANK2, BANK3 and BANK4, and detect a voltage level of the core voltage terminal on the basis of a second target level in response to the active signals ACT1, ACT2, ACT3 and ACT4. The charge drivers 340A, 340B, 340C and 340D are respectively assigned to the banks BANK1, BANK2, BANK3 and BANK4, and drive the core voltage terminal to be charged in response to the respective active signals ACT1, ACT2, ACT3 and ACT4 and respective charge control signals CH_CON1, CH_CON2, CH_CON3 and CH_CON4 outputted from the charge level detectors 330A, 330B, 330C and 330D.

In addition, the semiconductor memory device of the first embodiment further includes an active signal generator 380 and a reference voltage generator 320. The active signal generator 380 generates the active signals ACT1, ACT2, ACT3 and ACT4 corresponding to each operation of the banks BANK1, BANK2, BANK3 and BANK4, respectively. The reference voltage generator 320 generates and supplies a reference voltage VREF corresponding to the first target level to the common discharge level detector 300, and also generates and supplies a reference voltage VREF corresponding to the second target level to the charge level detectors 330A, 330B, 330C and 330D.

Although FIG. 3 illustrates that the reference voltage VREF corresponding to the first target level and the reference voltage VREF corresponding to the second target level, which are outputted from the reference voltage generator 320, are equal to each other, they may be different from each other. For example, when the first target level is different from the second target level, a voltage level of the reference voltage VREF corresponding to the first target level used in controlling the discharge drivers 310A, 310B, 310C and 310D in the common discharge level detector 300 may be higher than a voltage level of the reference voltage VREF corresponding to the second target level used in controlling the charge drivers 340A, 340B, 340C and 340D in the charge level detectors 330A, 330B, 330C and 330D. That is, the reference voltage generator 320 may generate only one reference voltage VREF commonly used in the common discharge level detector 300, and the charge level detectors 330A, 330B, 330C and 330D. Alternatively, the reference voltage generator 320 may generate a reference voltages VREF with different levels so that the common discharge level detector 300 and the charge level detectors 330A, 330B, 330C and 330D may use the reference voltages VREF, respectively.

Figure 4:
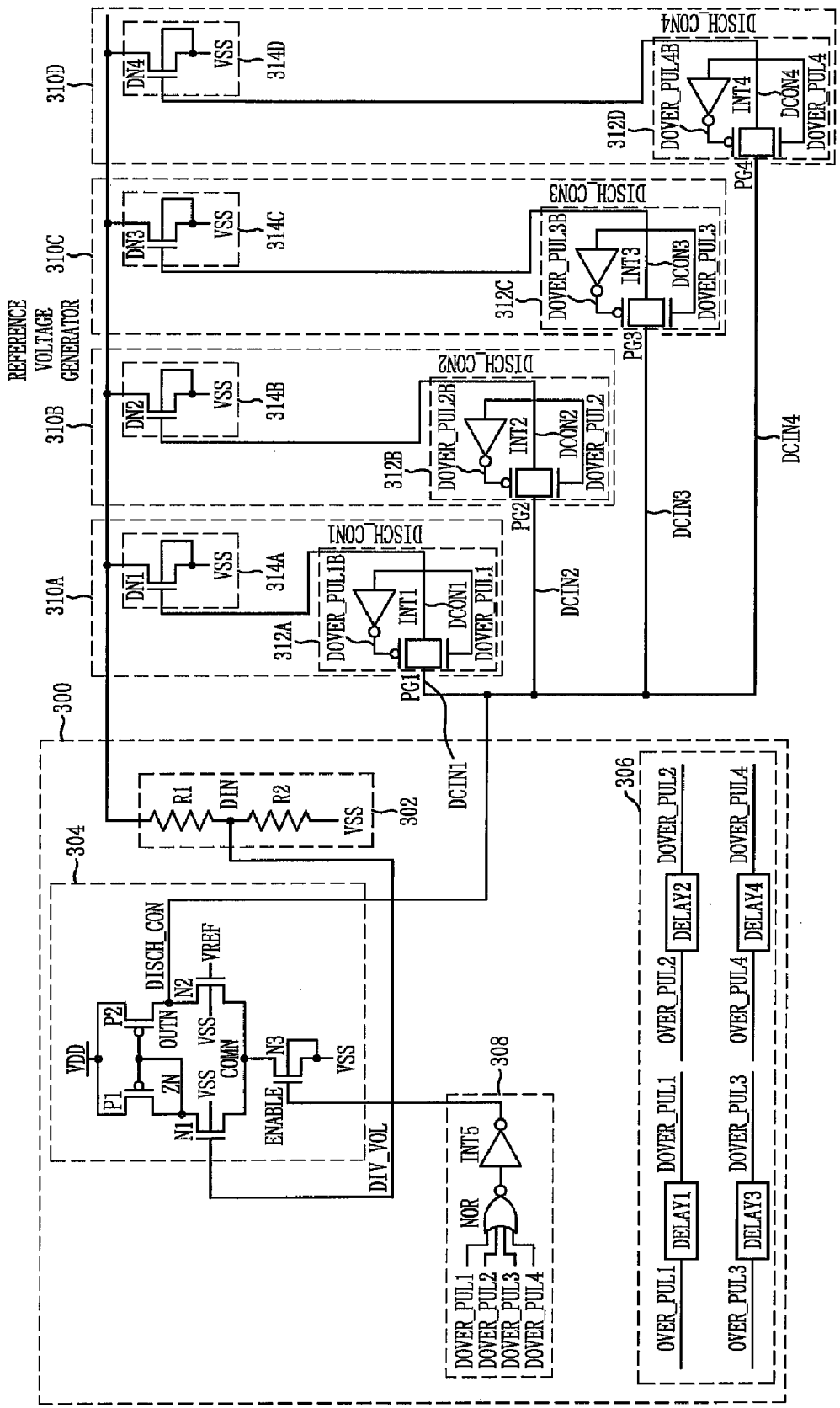
FIG. 4 is a circuit diagram illustrating a common discharge level detector and a discharge driver in the semiconductor memory device of FIG. 3.

FIG. 4 is a circuit diagram illustrating the common discharge level detector 300 and the discharge drivers 310A, 310B, 310C and 310D in the semiconductor memory device of FIG. 3.

Referring to FIG. 4, the common discharge level detector 300 includes a voltage divider 302, a voltage comparator 304, a pulse delay 306 and an enable signal logic determiner 308. The voltage divider 302 divides a voltage level of the core voltage terminal by a predetermined ratio to generate a division voltage DIV_VOL. The voltage comparator 304 compares a level of the division voltage DIV_VOL with a level of the reference voltage VREF corresponding to the first target level, and is turned on/off in response to an enable signal ENABLE inputted as a bias. The pulse delay 306 delays the overdriving pulses OVER_PUL1, OVER_PUL2, OVER_PUL3 and OVER_PUL4 by predetermined delay times to generate a plurality of delay pulses DOVER_PUL1, DOVER_PUL2, DOVER_PUL3 and DOVER_PUL4. The enable signal logic determiner 308 determines a logic level of the enable signal ENABLE in response to the delay pulses DOVER_PUL1 DOVER_PUL2, DOVER_PUL3 and DOVER_PUL4.

The voltage divider 302 of the common discharge level detector 300 includes first and second resistors R1 and R2 connected in series between the core voltage terminal and a ground voltage terminal, and outputs the division voltage DIV_VOL through a connection node DIN between the first and second resistors R1 and R2.

The voltage comparator 304 of the common discharge level detector 300 includes first to third NMOS transistors N1, N2 and N3, and first and second PMOS transistors P1 and P2. The first NMOS transistor N1 includes a gate receiving the division voltage DIV_VOL, a drain connected to a driving node ZN and a source connected to a common node COMN, and thus adjusts the amount of current flowing between the driving node ZN and the common node COMN in response to a level of the division voltage DIV_VOL. The second NMOS transistor N2 includes a gate receiving the reference voltage VREF corresponding to the first target level, a drain connected to an output node OUTN and a source connected to the common node COMN, and thus adjusts the amount of current flowing between the output node OUTN and the common node COMN in response to a level of the reference voltage VREF corresponding to the first target level. The first and second PMOS transistors P1 and P2 are connected to each other in a current mirror configuration between the driving node ZN and the output node OUTN, and control the current flowing through the driving node ZN and the current flowing through the output node OUTN to be equal to each other. The third NMOS transistor N3 includes a gate receiving the enable signal ENABLE, a drain connected to the common node COMN, and a source connected to the ground voltage terminal, and is turned on in response to a logic level of the enable signal ENABLE.

The enable signal logic determiner 308 of the common discharge level detector 300 includes a NOR gate NOR configured to perform a NOR operation on the delay pulses DOVER_PUL1, DOVER_PUL2, DOVER_PUL3 and DOVER_PUL4, and an inverter INT5 configured to receive an output signal of the NOR gate NOR to output the enable signal ENABLE.

The first discharge driver 310A includes a first selector 312A configured to selectively apply the discharge control signal DISCH_CON inputted via an input terminal DCIN1 to an output terminal DCON1 corresponding to the delay pulse DOVER_PUL1 and a first driver 314A configured to drive the core voltage terminal to be discharged with a variable driving force in response to the applied discharge control signal DISCH_CON1 outputted through the output terminal DCON1. The second discharge driver 310B includes a second selector 312B configured to selectively apply the discharge control signal DISCH_CON inputted via an input terminal DCIN2 to an output terminal DCON2 corresponding to the delay pulse DOVER_PUL2, and a second driver 314B configured to drive the core voltage terminal to be discharged with a variable driving force in response to the applied discharge control signal DISCH_CON2 outputted through the output terminal DCON2. The third discharge driver 310C includes a third selector 312C configured to selectively apply the discharge control signal DISCH_CON inputted via an input terminal DCIN3 to an output terminal DCON3 corresponding to the delay pulse DOVER_PUL3, and a third driver 314C configured to drive the core voltage terminal to be discharged with a variable driving force in response to the applied discharge control signal DISCH_CON3 outputted through the output terminal DCON3. The fourth discharge driver 310D includes a fourth selector 312D configured to selectively apply the discharge control signal DISCH_CON inputted via an input terminal DCIN4 to an output terminal DCON4 corresponding to the delay pulse DOVER_PUL4, and a fourth driver 314D configured to drive the core voltage terminal to be discharged with a variable driving force in response to the applied discharge control signal DISCH_CON4 outputted through the output terminal DCON4.

The first selector 312A of the first discharge driver 310A includes an inverter INT1 configured to receive the delay pulse DOVER_PUL1 to output a delay inversion pulse DOVER_PUL1B, and a pass gate PG1 configured to selectively apply the discharge control signal DISCH_CON applied to the input terminal DCIN1 to the output terminal DCON1 in response to the delay pulse DOVER_PUL1 and the delay inversion pulse DOVER_PUL1B. The second selector 312B of the second discharge driver 310B includes an inverter INT2 configured to receive the delay pulse DOVER_PUL2 to output a delay inversion pulse DOVER_PUL2B, and a pass gate PG2 configured to selectively apply the discharge control signal DISCH_CON applied to the input terminal DCIN2 to the output terminal DCON2 in response to the delay pulse DOVER_PUL2 and the delay inversion pulse DOVER_PUL2B. The third selector 312C of the third discharge driver 310C includes an inverter INT3 configured to receive the delay pulse DOVER_PUL3 to output a delay inversion pulse DOVER_PUL3B, and a pass gate PG3 configured to selectively apply the discharge control signal DISCH_CON applied to the input terminal DCIN3 to the output terminal DCON3 in response to the delay pulse DOVER_PUL3 and the delay inversion pulse DOVER_PUL3B. The fourth selector 312D of the fourth discharge driver 310D includes an inverter INT4 configured to receive the delay pulse DOVER_PUL4 to output a delay inversion pulse DOVER_PUL4B, and a pass gate PG4 configured to selectively apply the discharge control signal DISCH_CON applied to the input terminal DCIN4 to the output terminal DCON4 in response to the delay pulse DOVER_PUL4 and the delay inversion pulse DOVER_PUL4B.

The first driver 314A of the first discharge driver 310A includes an NMOS transistor DN1 that is provided with a gate receiving the applied discharge control signal DISCH_CON1 outputted from the pass gate PG1, a drain connected to the core voltage terminal, and a source connected to the ground voltage terminal. The second driver 314B of the second discharge driver 310B includes an NMOS transistor DN2 that is provided with a gate receiving the applied discharge control signal DISCH_CON2 outputted from the pass gate PG2, a drain connected to the core voltage terminal, and a source connected to the ground voltage terminal. The third driver 314C of the third discharge driver 310C includes an NMOS transistor DN3 that is provided with a gate receiving the applied discharge control signal DISCH_CON3 outputted from the pass gate PG3, a drain connected to the core voltage terminal, and a source connected to the ground voltage terminal. The fourth driver 314D of the fourth discharge driver 310D includes an NMOS transistor DN4 that is provided with a gate receiving the applied discharge control signal DISCH_CON4 outputted from the pass gate PG4, a drain connected to the core voltage terminal, and a source connected to the ground voltage terminal.

Operation of the semiconductor memory device in accordance with the first embodiment of the invention, which has the above-described construction, will be described below.

Figure 1:
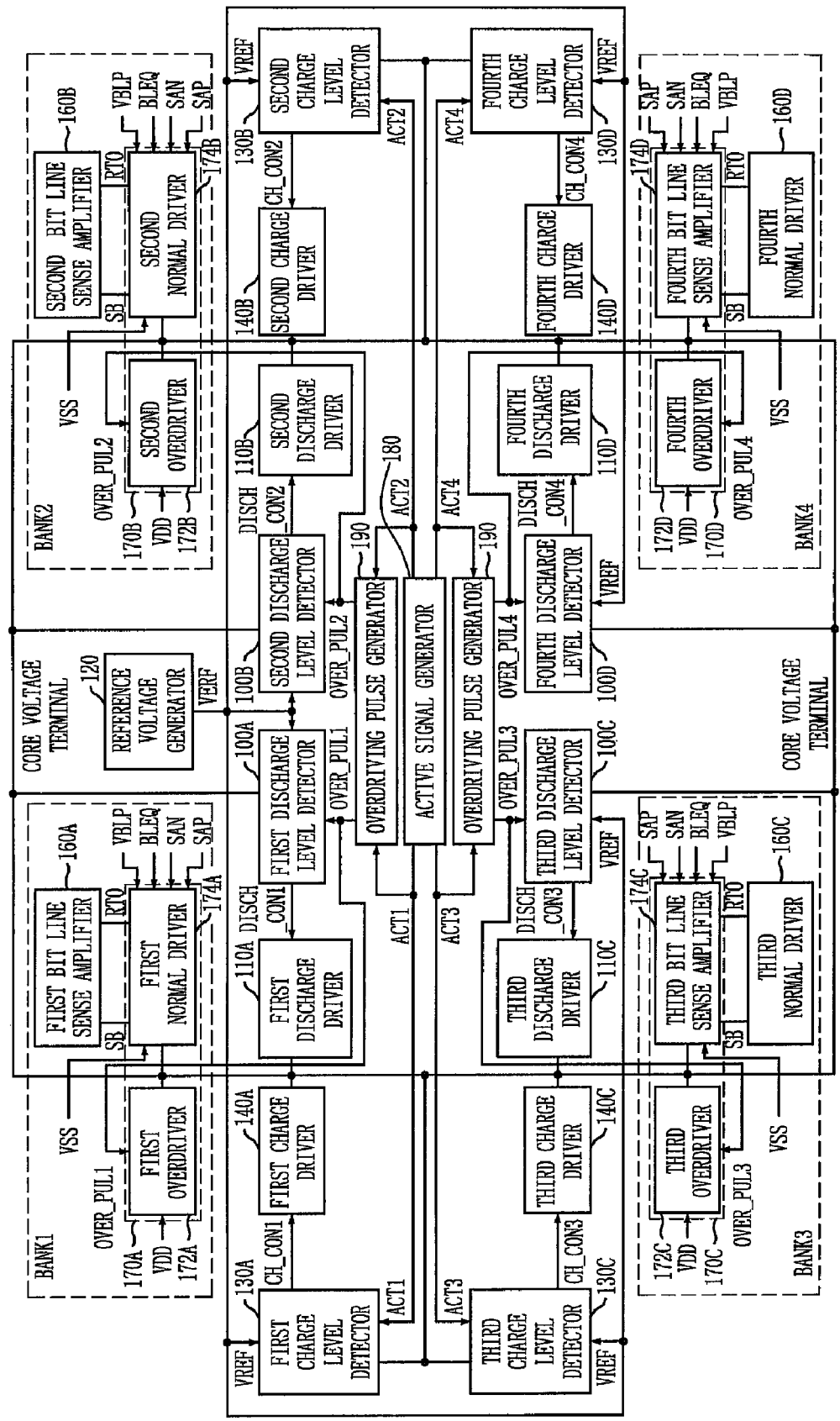
FIG. 1 is a block diagram of a semiconductor memory device adopting a conventional discharge driving method.

As described already in the conventional semiconductor memory device of FIG. 1, during a period when one of the banks BANK1, BANK2, BANK3 and BANK4 is enabled so that at least one of the active signals ACT1, ACT2, ACT3 and ACT4 is activated, at least one of the charge level detectors 330A, 330B, 330C and 330D operates to detect a voltage level of the core voltage terminal on the basis of a second target level.

When at least one of the charge level detectors 330A, 330B, 330C and 330D detects the voltage level of the core voltage terminal to be lower than the second target level, the voltage level of the core voltage terminal is increased by controlling at least one of the charge drivers 340A, 340B, 340C and 340D to perform a pull-up operation.

On the contrary, when at least one of the charge level detectors 330A, 330B, 330C and 330D detects the voltage level of the core voltage terminal to be higher than the second target level, the charge drivers 340A, 340B, 340C and 340D are controlled not to perform the pull-up operation until the voltage level of the core voltage VCORE is lower than the second target level through natural discharge or operation of the discharge drivers 310A, 310B, 310C and 310D.

Independently of the operation of the charge level detectors 330A, 330B, 330C and 330D, at least one of the overdriving pulses OVER_PUL1, OVER_PUL2, OVER_PUL3 and OVER_PUL4 is activated in response to at least one active signal ACT1, ACT2, ACT3 or ACT4 in the overdriving pulse generator 390. Accordingly, at least one of the banks BANK1, BANK2, BANK3 and BANK4 receiving at least one overdriving pulse OVER_PUL1, OVER_PUL2, OVER_PUL3 or OVER_PUL4 performs an overdriving operation. While the overdriving operation is being performed, the voltage level of the core voltage terminal is rapidly increased to the level of the power supply voltage VDD. Resultingly, the voltage level of the core voltage terminal becomes higher than the second target level as well as the first target level.

The common discharge level detector 300 receives all the overdriving pulses OVER_PUL1, OVER_PUL2, OVER_PUL3 and OVER_PUL4, and is turned on/off in response to activation of one of the overdriving pulses OVER_PUL1, OVER_PUL2, OVER_PUL3 and OVER_PUL4, which significantly differs from the conventional semiconductor memory device of FIG. 1.

Of course, like the conventional art, the common discharge level detector 300 of the first embodiment operates in response to the delay pulse DOVER_PUL1, DOVER_PUL2, DOVER_PUL3 or DOVER_PUL4 obtained by delaying the overdriving pulse OVER_PUL1, OVER_PUL2, OVER_PUL3 or OVER_PUL4 by a predetermined time. Consequently, it is possible to control an overdriving point of the bank to differ from an operating point of at least one of the discharge drivers 310A, 310B, 310C and 310D.

That is, a plurality of pulse delays 306A, 306B, 306C and 306D delay the overdriving pulses OVER_PUL1, OVER_PUL2 OVER_PUL3 and OVER_PUL4 by predetermined times to output the delay pulses DOVER_PUL1, DOVER_PUL2, DOVER_PUL3 and DOVER_PUL4, respectively. The common discharge level detector 300 detects the voltage level of the core voltage terminal on the basis of the first target level in response to activation of one of the delay pulses DOVER_PUL1, DOVER_PUL2, DOVER_PUL3 and DOVER_PUL4.

At this point of time when at least one of the discharge level detectors 300A, 300B, 300C and 300D detects the voltage level of the core voltage terminal on the basis of the first target level, at least one enabled bank BANK1, BANK2, BANK3 or BANK4 has performed overdriving operation already. Therefore, the voltage level of the core voltage terminal has been increased to be much higher than the first target level. Accordingly, the common discharge level detector 300 controls at least one of the discharge drivers 310A, 310B, 310C and 310D to be operated to decrease the voltage level of the core voltage terminal.

Of course, in the case where overdriving operation is performed to a voltage level lower than a target level of the power supply voltage VDD because the power supply voltage VDD is a voltage inputted from the outside, the common discharge level detector 300 appropriately controls at least one of the discharge drivers 310A, 310B, 310C and 310D not to be operated, thereby preventing the voltage level of the core voltage terminal from being excessively lowered.

Comparing the semiconductor memory device of the invention with the conventional semiconductor memory device, the operating point of the common discharge level detector 300 in accordance with the first embodiment is equal to the operating point of the discharge level detectors (100A, 100B, 100C and 100D of FIGS. 1 and 2A) because the common discharge level detector 300 and the discharge level detectors (100A, 100B, 100C and 100D of FIGS. 1 and 2A) operate after one of the banks BANK1, BANK2, BANK3 and BANK4 performs the overdriving operation.

In the conventional semiconductor memory device, however, the discharge level detectors (100A, 100B, 100C and 100D of FIGS. 1 and 2A) correspond one-to-one to the banks (BANK1, BANK2, BANK3 and BANK4) and thus one of the discharge level detector 300 operates but the others do not operate. On the contrary, the banks BANK1, BANK2, BANK3 and BANK4 share the common discharge level detector 300 so that the common discharge level detector 300 operates even if any one of the banks BANK1, BANK2, BANK3 and BANK4 is enabled.

For example, in the conventional semiconductor memory device of FIG. 1, only the first discharge level detector (100A) operates but the others (100B, 100C and 100D) do not operate if the first bank (BANK1) is enabled to perform overdriving operation. For another example, if the fourth bank (BANK4) is enabled to perform overdriving operation, only the fourth discharge level detector (100D) operates but the others (100A, 100B and 100C) do not operate.

However, although any bank, e.g., BANK1 or BANK4, is activated, the common discharge level detector 300 of the first embodiment operates if one of the banks is enabled and the voltage level of the core voltage terminal is higher than the first target level.

Figure 2A:
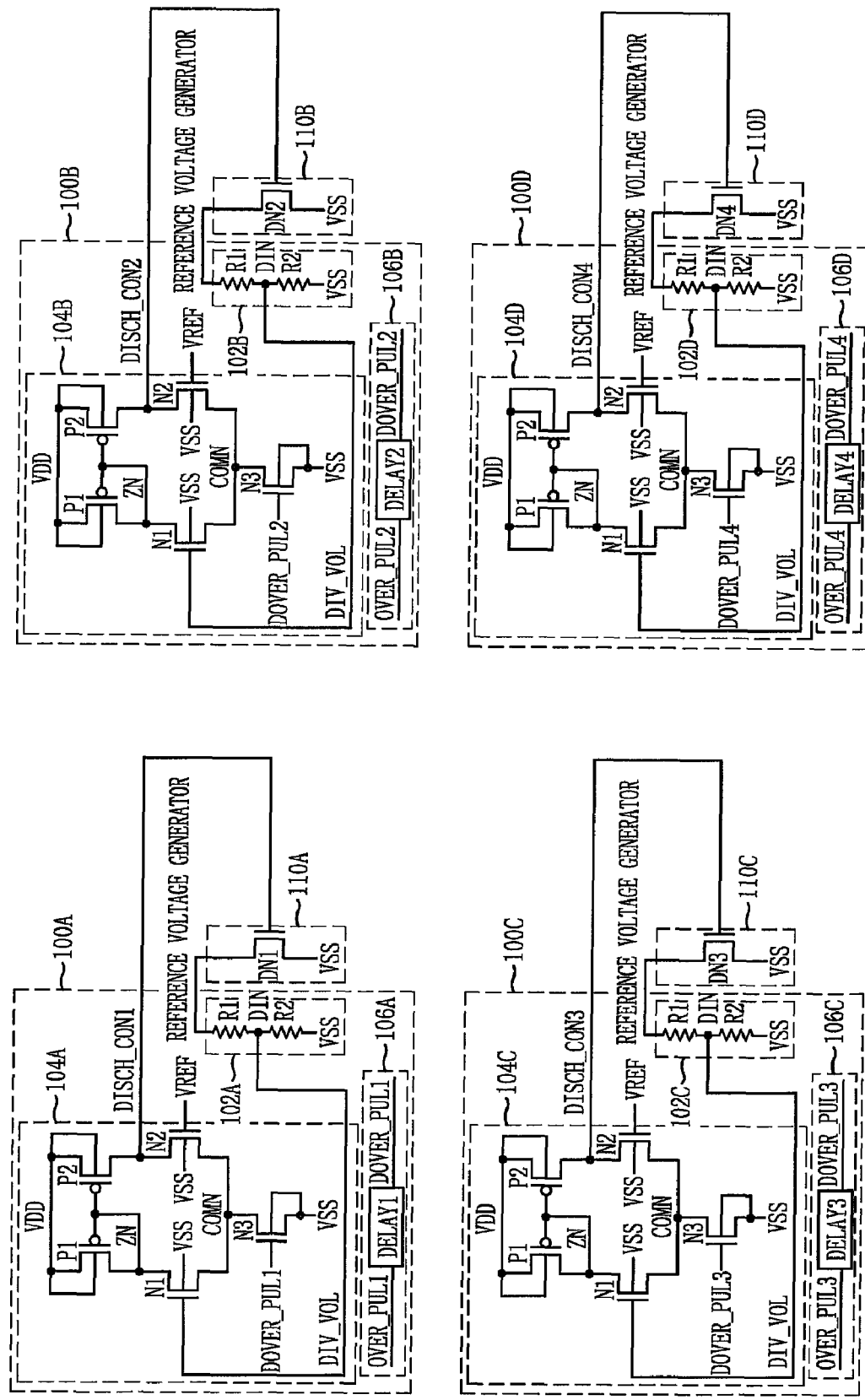
FIG. 2A is a circuit diagram illustrating a plurality of discharge level detectors and a plurality of discharge drivers in the semiconductor memory device of FIG. 1.

As illustrated in FIGS. 2 and 4, the common discharge level detector 300 of the first embodiment has the similar circuit configuration as the discharge level detectors (100A, 100B, 100C and 100D of FIGS. 1 and 2A) of the conventional semiconductor memory device. Therefore, it can be appreciated that number of comparators and resistors used in the discharge level detectors (100A, 100B, 100C and 100D of FIGS. 1 and 2A) are four times number of those used in the common discharge level detector 300 of the first embodiment.

That is, the common discharge level detector 300 in accordance with the first embodiment of the invention is lower in occupation area than the discharge level detectors (100A, 100B, 100C and 100D of FIGS. 1 and 2A) in the semiconductor memory device.

As described above, the semiconductor memory device adopting the discharge driving method of the first embodiment can prevent an area of the semiconductor memory device from being increased because the banks BANK1, BANK2, BANK3 and BANK4 share the common discharge level detector 300, which occupies a relatively large area in the semiconductor memory device.

In addition, even if the banks BANK1, BANK2, BANK3 and BANK4 are simultaneously enabled, the voltage level of the core voltage terminal is not duplicately detected, thus preventing an unnecessary current consumption.

Embodiment 2

Figure 5:
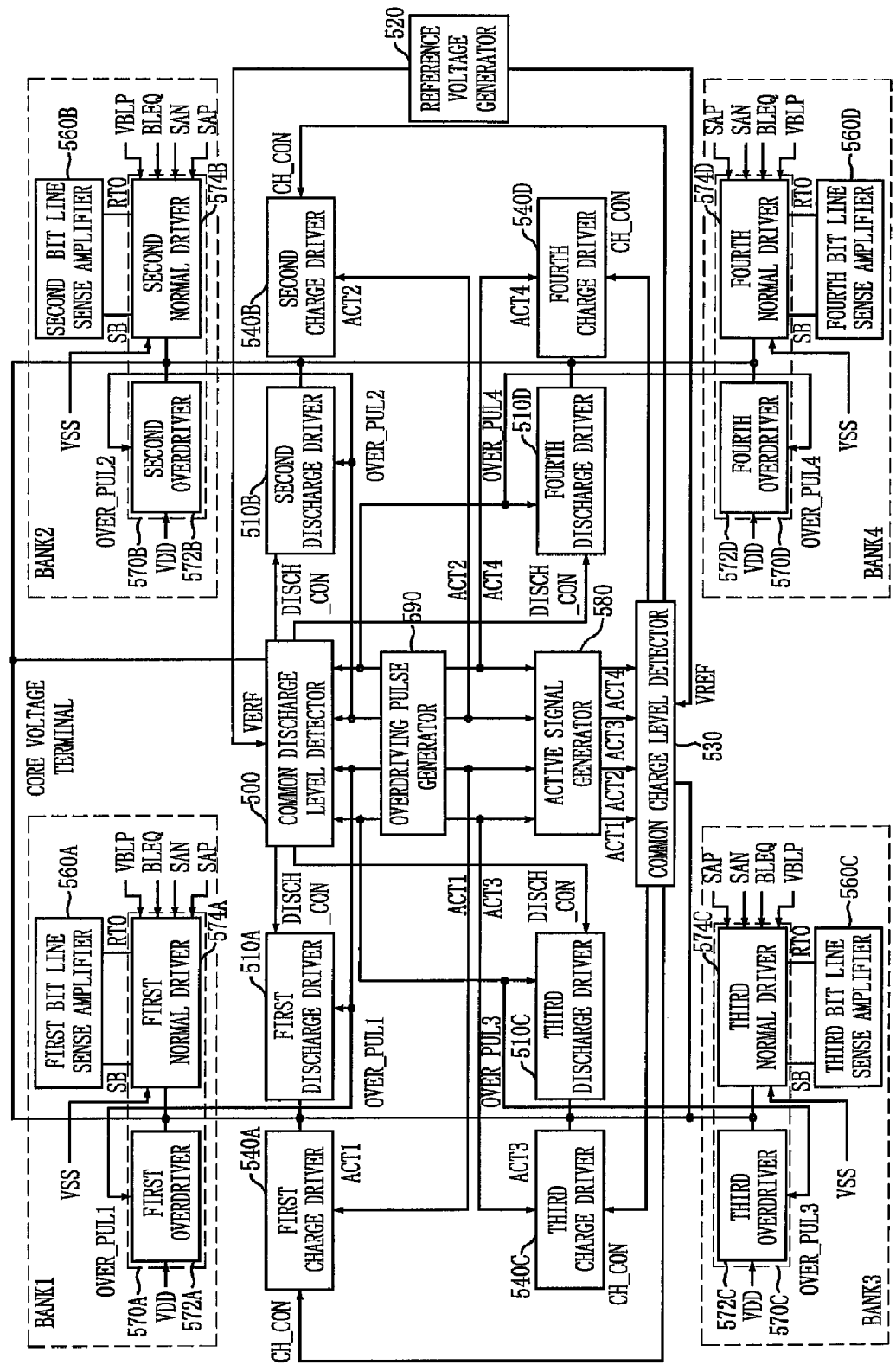
FIG. 5 is a block diagram of a semiconductor memory device adopting a discharge driving method in accordance with a second embodiment of the invention.

FIG. 5 is a block diagram of a semiconductor memory device adopting a discharge driving method in accordance with a second embodiment of the invention.

Referring to FIG. 5, the semiconductor memory device adopting a discharge driving method in accordance with the second embodiment of the invention includes a plurality of banks BANK1, BANK2, BANK3 and BANK4, an overdriving pulse generator 590, a common discharge level detector 500, a plurality of discharge drivers 510A, 510B, 510C and 510D, a plurality of charge level detectors 530A, 530B, 530C and 530D, and a plurality of charge drivers 540A, 540B, 540C and 540D.

Each of the banks BANK1, BANK2, BANK3 and BANK4 includes a bit line sense amplifier and an overdriver. For instance, the first bank BANK1 includes a first bit line sense amplifier 560A configured to sense and amplify data carried on a bit line, and a first overdriver 570A configured to drive a power line RTO of the first bit line sense amplifier 560A with a core voltage VCORE or an overdriving voltage VDD. Similarly, the second bank BANK2 includes a second bit line sense amplifier 560B and a second overdriver 570B, the third bank BANK3 includes a third bit line sense amplifier 560C and a third overdriver 570C, and the fourth bank BANK4 includes a fourth bit line sense amplifier 560D and a fourth overdriver 570D. The overdriving pulse generator 590 generates a plurality of overdriving pulses OVER_PUL1, OVER_PUL2, OVER_PUL3 and OVER_PUL4 so as to control overdriving operation of each of the banks BANK1, BANK2, BANK3 and BANK4 in response to active signals ACT1, ACT2, ACT3 and ACT4 corresponding to the respective banks BANK1, BANK2, BANK3 and BANK4. The common discharge level detector 500 detects a voltage level of a core voltage terminal on the basis of a first target level in response to each of the overdriving pulses OVER_PUL1, OVER_PUL2, OVER_PUL3 and OVER_PUL4. The discharge drivers 510A, 510B, 510C and 510D are respectively assigned to the banks BANK1, BANK2, BANK3 and BANK4, and drive the core voltage terminal to be discharged in response to the respective overdriving pulses OVER_PUL1, OVER_PUL2, OVER_PUL3 and OVER_PUL4 and discharge control signals DISCH_CON outputted from the common discharge level detector 500. The common charge level detector 530 detects a voltage level of the core voltage terminal on the basis of a second target level in response to the active signals ACT1, ACT2, ACT3 and ACT4. The charge drivers 540A, 540B, 540C and 540D are respectively assigned to the banks BANK1, BANK2, BANK3 and BANK4, and drive the core voltage terminal to be charged in response to the respective active signals ACT1, ACT2, ACT3 and ACT4 and charge control signals CH_CON outputted from common charge level detector 530.

In addition, the semiconductor memory device of the second embodiment further includes an active signal generator 580 and a reference voltage generator 520. The active signal generator 580 generates the active signals ACT1, ACT2, ACT3 and ACT4 corresponding to each operation of the banks BANK1, BANK2, BANK3 and BANK4, respectively. The reference voltage generator 520 generates and supplies a reference voltage VREF corresponding to the first target level to the common discharge level detector 500, and also generates and supplies a reference voltage VREF corresponding to the second target level to the common charge level detector 530.

Although FIG. 5 illustrates that the reference voltage VREF corresponding to the first target level and the reference voltage VREF corresponding to the second target level, which are outputted from the reference voltage generator 520, are equal to each other, they may be different from each other. For example, when the first target level is different from the second target level, a voltage level of the reference voltage VREF corresponding to the first target level used in controlling the discharge drivers 510A, 510B, 510C and 510D in the common discharge level detector 500 may be higher than a voltage level of the reference voltage VREF corresponding to the second target level used in controlling the charge drivers 540A, 540B, 540C and 540D in the common charge level detector 530. That is, the reference voltage generator 520 may generate only one reference voltage VREF commonly used in the common discharge level detector 500 and the common charge level detector 530. Alternatively, the reference voltage generator 520 may generate a plurality of reference voltages VREF with different levels so that the common discharge level detector 500 and the common charge level detector 530 may use the reference voltages VREF, respectively.

Figure 6:
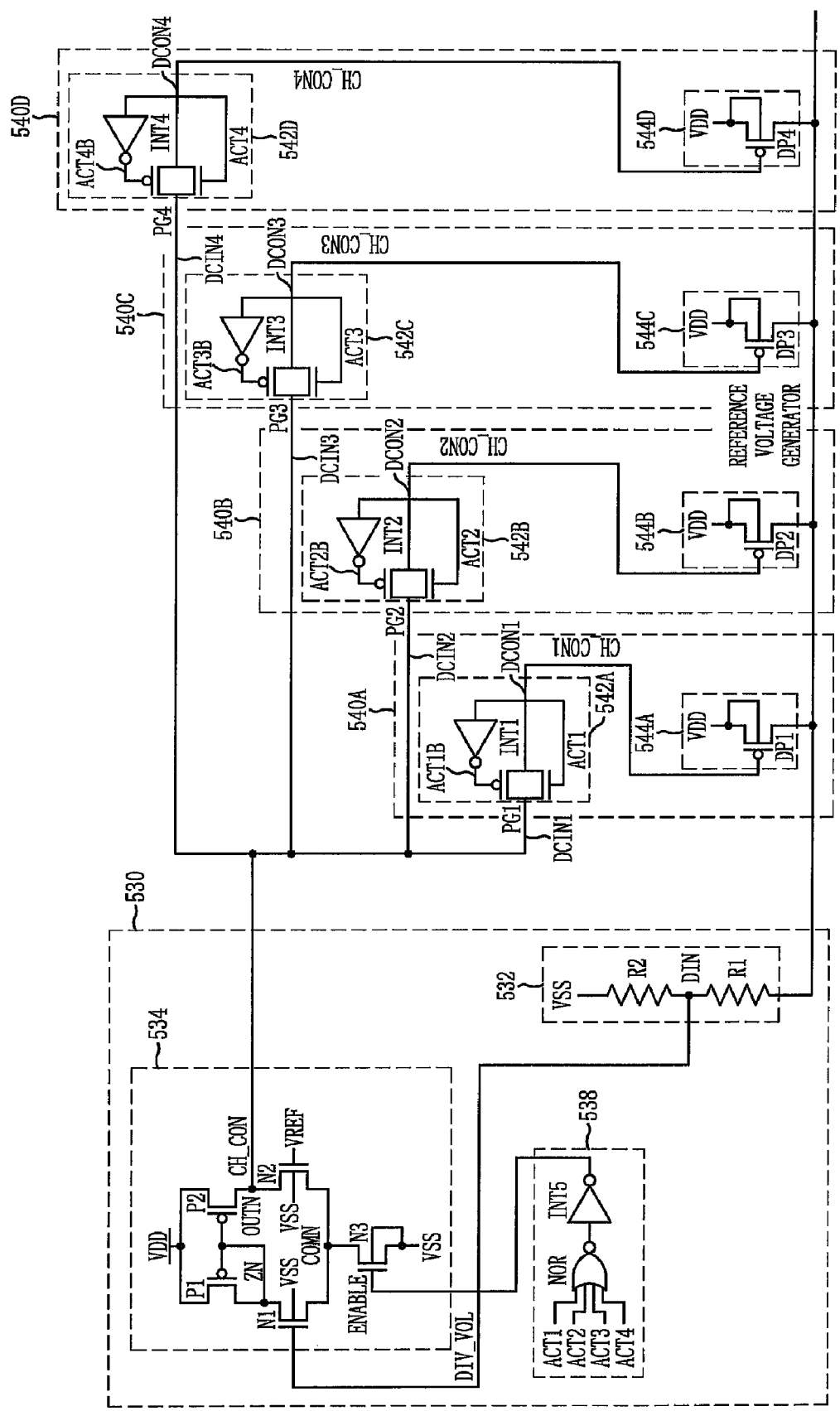
FIG. 6 is a circuit diagram illustrating a common charge level detector and a charge driver in the semiconductor memory device of FIG. 5.

FIG. 6 is a circuit diagram illustrating the common charge level detector 530 and the charge drivers 540A, 540B, 540C and 540D in the semiconductor memory device of FIG. 5.

Referring to FIG. 6, the common charge level detector 530 includes a voltage divider 532, a voltage comparator 534 and an enable signal logic determiner 538. The voltage divider 532 divides a voltage level of the core voltage terminal by a predetermined ratio to generate a division voltage DIV_VOL. The voltage comparator 534 compares a level of the division voltage DIV_VOL with a level of the reference voltage VREF corresponding to the first target level, and is turned on/off in response to an enable signal ENABLE. The enable signal logic determiner 538 determines a logic level of the enable signal ENABLE in response to the active signals ACT1, ACT2, ACT3 and ACT4.

The voltage comparator 534 of the common charge level detector 530 includes first to third NMOS transistors N1, N2 and N3, and first and second PMOS transistors P1 and P2. The first NMOS transistor N1 includes a gate receiving the division voltage DIV_VOL, a drain connected to a driving node ZN and a source connected to a common node COMN, and thus adjusts the amount of current flowing between the driving node ZN and the common node COMN in response to a level of the division voltage DIV_VOL. The second NMOS transistor N2 includes a gate receiving the reference voltage VREF corresponding to the first target level, a drain connected to an output node OUTN and a source connected to the common node COMN, and thus adjusts the amount of current flowing between the output node OUTN and the common node COMN in response to a level of the reference voltage VREF corresponding to the first target level. The first and second PMOS transistors P1 and P2 are connected to each other in a current mirror configuration between the driving node ZN and the output node OUTN, and control the current flowing through the driving node ZN and the current flowing through the output node OUTN to be equal to each other. The third NMOS transistor N3 includes a gate receiving the enable signal ENABLE, a drain connected to the common node COMN, and a source connected to the ground voltage terminal, and is turned on in response to a logic level of the enable signal ENABLE.

The voltage divider 532 of the common charge level detector 530 includes first and second resistors R1 and R2 connected in series between the core voltage terminal and a ground voltage terminal, and outputs the division voltage DIV_VOL through a connection node DIN between the first and second resistors R1 and R2.

The enable signal logic determiner 538 of the common charge level detector 530 includes a NOR gate NOR configured to perform a NOR operation on the active signals ACT1, ACT2, ACT3 and ACT4, and an inverter INT5 configured to receive an output signal of the NOR gate NOR to output the enable signal ENABLE.

The first charge driver 540A includes a first selector 542A configured to selectively apply the charge control signal CH_CON inputted via an input terminal DCIN1 to an output terminal DCON1 corresponding to the active signal ACT1, and a first driver 544A configured to drive the core voltage terminal to be charged with a variable driving force in response to the applied charge control signal CH_CON1 outputted through the output terminal DCON1. The second charge driver 540B includes a second selector 542B configured to selectively apply the charge control signal CH_CON inputted via an input terminal DCIN2 to an output terminal DCON2 corresponding to the active signal ACT2, and a second driver 544B configured to drive the core voltage terminal to be charged with a variable driving force in response to the applied charge control signal CH_CON2 outputted through the output terminal DCON2. The third charge driver 540C includes a third selector 542C configured to selectively apply the charge control signal CH_CON inputted via an input terminal DCIN3 to an output terminal DCON3 corresponding to the active signal ACT3, and a third driver 544C configured to drive the core voltage terminal to be charged with a variable driving force in response to the applied charge control signal CH_CON3 outputted through the output terminal DCON3. The fourth charge driver 540D includes a fourth selector 542D configured to selectively apply the charge control signal CH_CON inputted via an input terminal DCIN4 to an output terminal DCON4 corresponding to the active signal ACT4, and a fourth driver 544D configured to drive the core voltage terminal to be charged with a variable driving force in response to the applied charge control signal CH_CON4 outputted through the output terminal DCON4.

The first selector 542A of the first charge driver 540A includes an inverter INT1 configured to receive the active signal ACT1 to output an active inversion signal ACT1B, and a pass gate PG1 configured to selectively apply the charge control signal CH_CON applied to the input terminal DCIN1 to the output terminal DCON1 in response to the active signal ACT1 and the active inversion signal ACT1B. The second selector 542B of the second charge driver 540B includes an inverter INT2 configured to receive the active signal ACT2 to output an active inversion signal ACT2B, and a pass gate PG2 configured to selectively apply the charge control signal CH_CON applied to the input terminal DCIN2 to the output terminal DCON2 in response to the active signal ACT2 and the active inversion signal ACT2B. The third selector 542C of the third charge driver 540C includes an inverter INT3 configured to receive the active signal ACT3 to output an active inversion signal ACT3B, and a pass gate PG3 configured to selectively apply the charge control signal CH_CON applied to the input terminal DCIN3 to the output terminal DCON3 in response to the active signal ACT3 and the active inversion signal ACT3B. The fourth selector 542D of the fourth charge driver 540D includes an inverter INT4 configured to receive the active signal ACT4 to output an active inversion signal ACT34, and a pass gate PG4 configured to selectively apply the charge control signal CH_CON applied to the input terminal DCIN4 to the output terminal DCON4 in response to the active signal ACT4 and the active inversion signal ACT4B.

The first driver 544A of the first charge driver 540A includes a PMOS transistor DP1 that is provided with a gate receiving the applied charge control signal CH_CON1 outputted from the pass gate PG1, a source connected to a power supply voltage terminal, and a drain connected to the core voltage terminal. The second driver 544B of the second charge driver 540B includes a PMOS transistor DP2 that is provided with a gate receiving the applied charge control signal CH_CON2 outputted from the pass gate PG2, a source connected to the power supply voltage terminal, and a drain connected to the core voltage terminal. The third driver 544C of the third charge driver 540C includes a PMOS transistor DP3 that is provided with a gate receiving the applied charge control signal CH_CON3 outputted from the pass gate PG3, a source connected to the power supply voltage terminal, and a drain connected to the core voltage terminal. The fourth driver 544D of the fourth charge driver 540D includes a PMOS transistor DP4 that is provided with a gate receiving the applied charge control signal CH_CON4 outputted from the pass gate PG4, a source connected to the power supply voltage terminal, and a drain connected to the core voltage terminal.

While the banks BANK1, BANK2, BANK3 and BANK4 share the common discharge level detector 300 but do not share the charge level detectors 330A, 330B, 330AC and 330D in the semiconductor memory device in accordance with the first embodiment of FIG. 3, the banks BANK1, BANK2, BANK3 and BANK4 share the common charge level detector 530 as well as the common discharge level detector 500 in the semiconductor memory device in accordance with the second embodiment of FIG. 5.

The common discharge level detector 500 of the second embodiment is identical in configuration and operation to the common discharge level detector 300 of the first embodiment, and thus further description for it will be omitted herein. Since the common charge level detector 530 of the second embodiment is different from the common discharge level detector 500, differences therebetween will be mainly described below.

While the common discharge level detector 500 detects the voltage level of the core voltage on the basis of the first target level when one of the overdriving pulses OVER_PUL1, OVER_PUL2, OVER_PUL3 and OVER_PUL4 is activated, the common charge level detector 530 detects the voltage level of the core voltage on the basis of the second target level when one of the active signals ACT1, ACT2, ACT3 and ACT4 is activated.

Further, while the common discharge level detector 500 operates when one of the banks BANK1, BANK2, BANK3 and BANK4 performs overdriving operation, the common charge level detector 530 operates when one of the banks BANK1, BANK2, BANK3 and BANK4 is enabled.

Figure 2B:
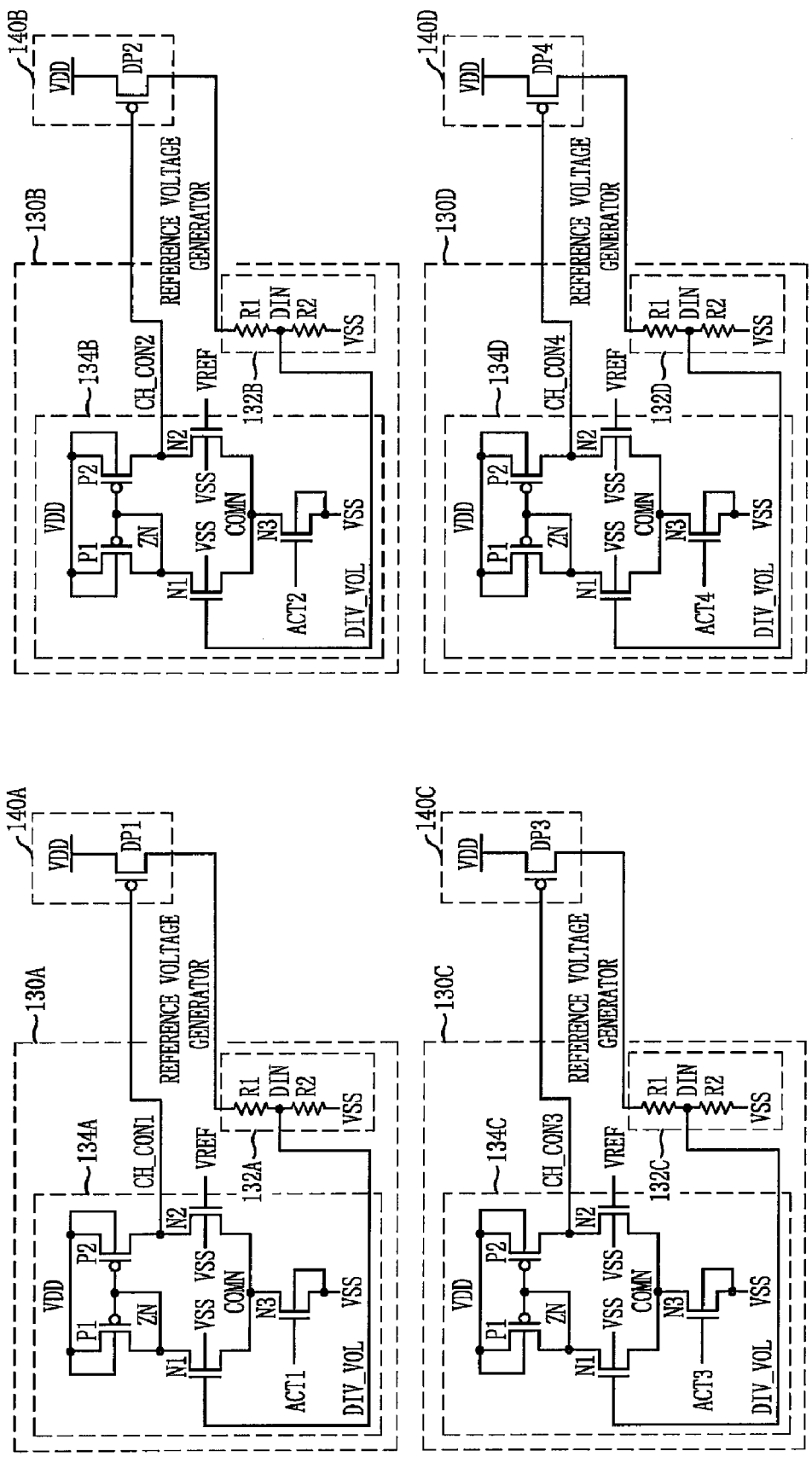
FIG. 2B is a circuit diagram illustrating a plurality of charge level detectors and a plurality of charge drivers in the semiconductor memory device of FIG. 1.

As illustrated in FIGS. 2 and 5, the common charge level detector 530 of the second embodiment is similar in configuration to each charge level detector (130A, 130B, 130C and 130D of FIG. 2B) in the conventional semiconductor memory device. Therefore, number of comparators and resistors used in the charge level detectors (130A, 130B, 130C and 130D of FIG. 2B) are four times number of those used in the common charge level detector 530 of the second embodiment.

That is, the common charge level detector 530 in accordance with the second embodiment of the invention is smaller in occupation area than the charge level detectors (130A, 130B, 130C and 130D of FIG. 2B) in the conventional semiconductor memory device.

As described above, the semiconductor memory device adopting the discharge driving method of the second embodiment can prevent an area of the semiconductor memory device from being increased because the banks BANK1, BANK2, BANK3 and BANK4 share the common discharge level detector 500 and the common charge level detector 530, which occupy a relatively large area in the semiconductor memory device.

In addition, even if the banks BANK1, BANK2, BANK3 and BANK4 are simultaneously enabled, the voltage level of the core voltage terminal is not duplicately detected, thus preventing an unnecessary current consumption.

Embodiment 3

Figure 7:
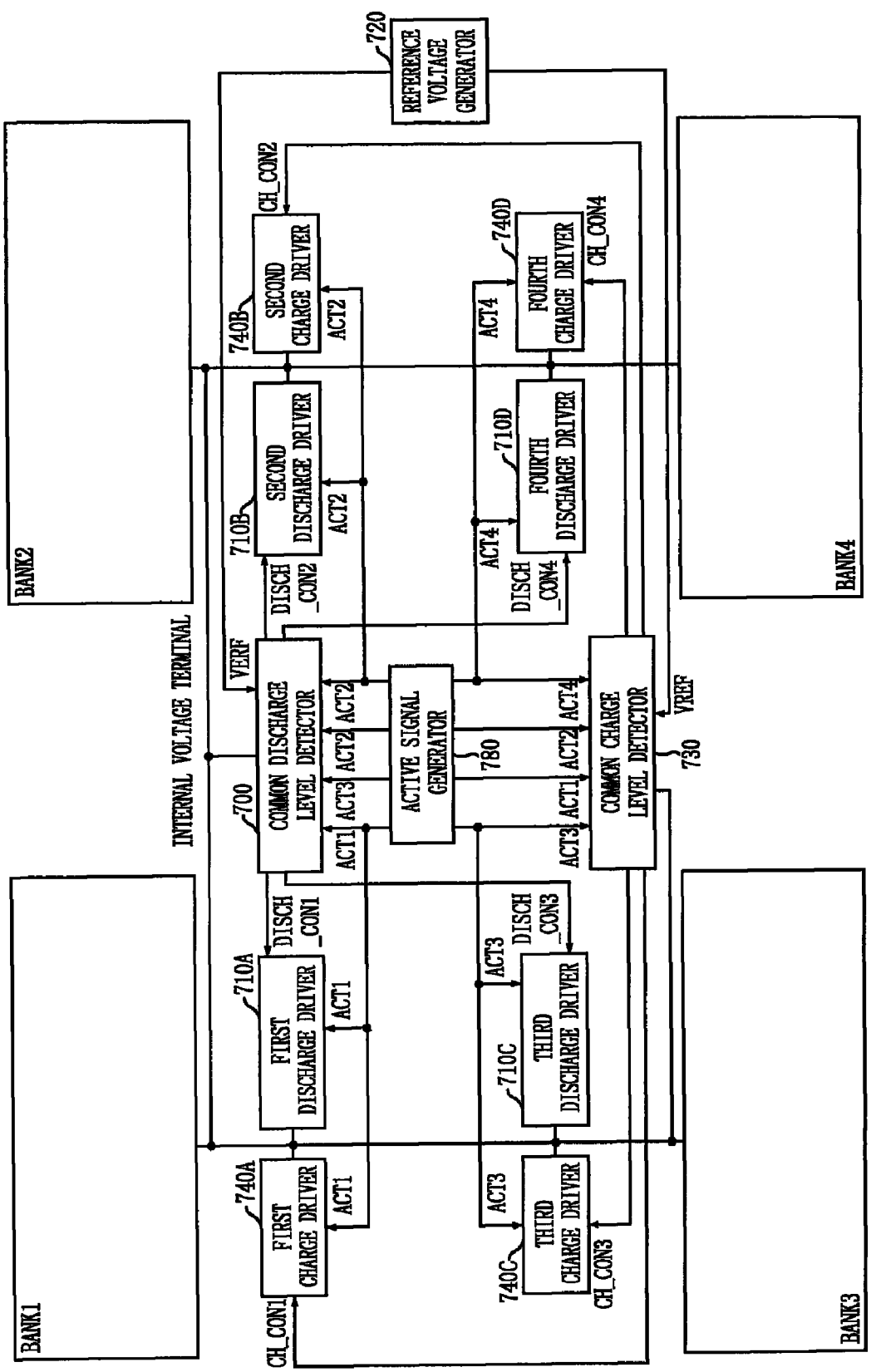
FIG. 7 is a block diagram of a semiconductor memory device adopting a discharge driving method in accordance with a third embodiment of the invention.

FIG. 7 is a block diagram of a semiconductor memory device adopting a discharge driving method in accordance with a third embodiment of the invention.

Referring to FIG. 7, the semiconductor memory device adopting a discharge driving method in accordance with the third embodiment of the invention includes a plurality of banks BANK1, BANK2, BANK3 and BANK4, a common discharge level detector 700, a common charge level detector 730, a plurality of discharge drivers 710A, 710B, 710C and 710D, and a plurality of charge drivers 740A, 740B, 740C and 740D.

The banks BANK1, BANK2, BANK3 and BANK4 receive an internal voltage to perform a predetermined operation. The common discharge level detector 700 detects a voltage level of an internal voltage terminal on the basis of a first target level when one of active signals ACT1, ACT2, ACT3 and ACT4 corresponding to each of the banks BANK1, BANK2, BANK3 and BANK4 is activated. The common charge level detector 730 detects a voltage level of the internal voltage terminal on the basis of a second target level when one of active signals ACT1, ACT2, ACT3 and ACT4 corresponding to each of the banks BANK1, BANK2, BANK3 and BANK4 is activated. The discharge drivers 710A, 710B, 710C and 710D are respectively assigned to the banks BANK1, BANK2, BANK3 and BANK4, and drive the internal voltage terminal to be discharged in response to the respective active signals ACT1, ACT2, ACT3 and ACT4 and respective discharge control signals DISCH_CON1, DISCH_CON2, DISCH_CON3 and DISCH_CON4 outputted from the common discharge level detector 700. The charge drivers 740A, 740B, 740C and 740D are respectively assigned to the banks BANK1, BANK2, BANK3 and BANK4, and drive the internal voltage terminal to be charged in response to the respective active signals ACT1, ACT2, ACT3 and ACT4 and respective charge control signals CH_CON1 CH_CON2, CH_CON3 and CH_CON4 outputted from common charge level detector 730.

In addition, the semiconductor memory device of the third embodiment further includes an active signal generator 780 and a reference voltage generator 720. The active signal generator 780 generates the active signals ACT1, ACT2, ACT3 and ACT4 corresponding to each operation of the banks BANK1, BANK2, BANK3 and BANK4, respectively. The reference voltage generator 720 generates and supplies a reference voltage VREF corresponding to the first target level to the common discharge level detector 700, and also generates and supplies a reference voltage VREF corresponding to the second target level to the common charge level detector 730.

Although FIG. 7 illustrates that the reference voltage VREF corresponding to the first target level and the reference voltage VREF corresponding to the second target level, which are outputted from the reference voltage generator 720, are equal to each other, they may be different from each other. For example, when the first target level is different from the second target level, a voltage level of the reference voltage VREF corresponding to the first target level used in controlling the discharge drivers 710A, 710B, 710C and 710D in the common discharge level detector 700 may be higher than a voltage level of the reference voltage VREF corresponding to the second target level used in controlling the charge drivers 740A, 740B, 740C and 740D in the common charge level detector 730. That is, the reference voltage generator 720 may generate only one reference voltage VREF commonly used in the common discharge level detector 700 and the common charge level detector 730. Alternatively, the reference voltage generator 720 may generate a plurality of reference voltages VREF with different levels so that the common discharge level detector 700 and the common charge level detector 730 may use the reference voltages VREF, respectively.

While the common discharge level detector 500 and the common charge level detector 530 are used to detect a level of the core voltage in the second embodiment of FIG. 5, the common discharge level detector 700 and the common charge level detector 730 are used to detect levels of all internal voltages used in operation of the semiconductor memory device as well as the level of the core voltage in the third embodiment of FIG. 7.

The banks BANK1, BANK2, BANK3 and BANK4 also share the common discharge level detector 700 and the common charge level detector 730 in the third embodiment of the invention.

The common discharge level detector 700 and the common charge level detector 730 of the third embodiment are similar in configuration and operation to the common discharge level detector 500 and the common charge level detector 530 of the second embodiment, and thus further description will be omitted herein.

For reference, all the internal voltages of the semiconductor memory device, which are used in performing predetermined operations in the semiconductor memory device, include, for example, a boosted voltage (VPP), a back bias voltage (VBB), a core voltage (VCORE) and a bit line precharge voltage (VBLP).

As described above, the semiconductor memory device adopting the discharge driving method of the third embodiment can prevent an area of the semiconductor memory device from being increased because the banks BANK1, BANK2, BANK3 and BANK4 share the common discharge level detector 700 and the common charge level detector 730, which occupy a relatively large area in the semiconductor memory device.

In addition, even if the banks BANK1, BANK2, BANK3 and BANK4 are simultaneously enabled, the voltage level of the internal voltage terminal is not duplicately detected, thus preventing an unnecessary current consumption.

Embodiment 4

Figure 8:
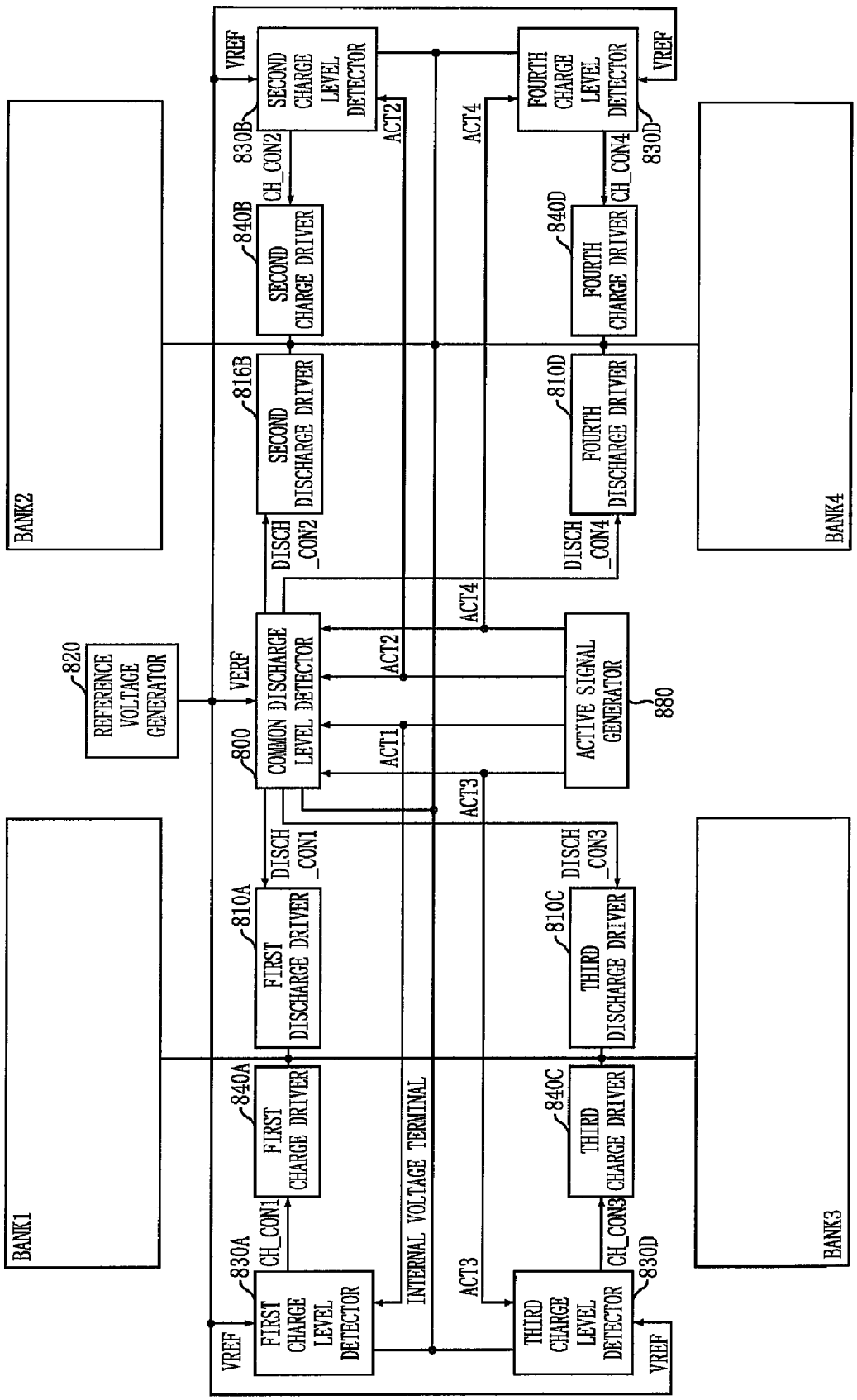
FIG. 8 is a block diagram of a semiconductor memory device adopting a discharge driving method in accordance with a fourth embodiment of the invention.

FIG. 8 is a block diagram of a semiconductor memory device adopting a discharge driving method in accordance with a fourth embodiment of the invention.

Referring to FIG. 8, the semiconductor memory device adopting a discharge driving method in accordance with the fourth embodiment of the invention includes banks BANK1, BANK2, BANK3 and BANK4, a common discharge level detector 800, and a discharge drivers 810A, 810B, 810C and 810D. The common discharge level detector 800 detects a voltage level of an internal voltage terminal on the basis of a first target level when one of active signals ACT1, ACT2, ACT3 and ACT4 corresponding to each of the banks BANK1, BANK2, BANK3 and BANK4 is activated. The discharge drivers 810A, 810B, 810C and 810D are respectively assigned to the banks BANK1, BANK2, BANK3 and BANK4, and drive the internal voltage terminal to be discharged in response to the respective active signals ACT1, ACT2, ACT3 and ACT4 and respective discharge control signals DISCH_CON1, DISCH_CON2, DISCH_CON3 and DISCH_CON4 outputted from the common discharge level detector 800. The semiconductor memory device of the fourth embodiment further includes a plurality of charge level detectors 830A, 830B, 830C and 830D, and a plurality of charge drivers 840A, 840B, 840C and 840D. The charge level detectors 830A, 830B, 830C and 830D are respectively assigned to the banks BANK1, BANK2, BANK3 and BANK4, and detect a voltage level of an internal voltage terminal on the basis of a second target level in response to the respective active signals ACT1, ACT2, ACT3 and ACT4. The charge drivers 840A, 840B, 840C and 840D are respectively assigned to the banks BANK1, BANK2, BANK3 and BANK4, and drive the internal voltage terminal to be charged in response to the respective active signals ACT1, ACT2, ACT3 and ACT4 and charge control signals CH_CON1, CH_CON2, CH_CON3 and CH_CON4 outputted from the charge level detectors 830A, 830B, 830C and 830D.

In addition, the semiconductor memory device of the fourth embodiment further includes an active signal generator 880 and a reference voltage generator 820. The active signal generator 880 generates the active signals ACT1, ACT2, ACT3 and ACT4 corresponding to each operation of the banks BANK1, BANK2, BANK3 and BANK4, respectively. The reference voltage generator 820 generates and supplies a reference voltage VREF corresponding to the first target level to the common discharge level detector 800, and also generates and supplies a reference voltage VREF corresponding to the second target level to the charge level detectors 830A, 830B, 830C and 830D.

Although FIG. 8 illustrates that the reference voltage VREF corresponding to the first target level and the reference voltage VREF corresponding to the second target level, which are outputted from the reference voltage generator 820, are equal to each other, they may be different from each other. For example, when the first target level is different from the second target level, a voltage level of the reference voltage VREF corresponding to the first target level used in controlling the discharge drivers 810A, 810B, 810C and 810D in the common discharge level detector 800 may be higher than a voltage level of the reference voltage VREF corresponding to the second target level used in controlling the charge drivers 840A, 840B, 840C and 840D in the charge level detectors 830A, 830B, 830C and 830D. That is, the reference voltage generator 820 may generate only one reference voltage VREF commonly used in the common discharge level detector 800 and the charge level detectors 830A, 830B, 830C and 830D. Alternatively, the reference voltage generator 820 may generate a plurality of reference voltages VREF with different levels so that the common discharge level detector 800 and the charge level detectors 830A, 830B, 830C and 830D may use the reference voltages VREF, respectively.

While the common discharge level detector 300 and the charge level detectors 330A, 330B, 330C and 330D are used to detect a voltage level of the core voltage terminal in the first embodiment of FIG. 3, the common discharge level detector 800 and the charge level detectors 830A, 830B, 830C and 830D are used to detect levels of all internal voltages used in operation of the semiconductor memory device as well as the core voltage level in the fourth embodiment of FIG. 8.

Further, the banks BANK1, BANK2, BANK3 and BANK4 share the common discharge level detector 700 and the common charge level detector 730 in the third embodiment of FIG. 7, whereas, in the fourth embodiment of FIG. 8, the banks BANK1, BANK2, BANK3 and BANK4 share the common discharge level detector 800 but do not share the charge level detectors 830A, 830B, 830C and 830D.

The common discharge level detector 800 and the charge level detectors 830A, 830B, 830C and 830D in accordance with the fourth embodiment are similar in configuration and operation to the common discharge level detector 300 and the charge level detectors 330A, 330B, 330C and 330D of the first embodiment in FIG. 3, and thus further description will be omitted herein.

For reference, all the internal voltages of the semiconductor memory device, which are used in performing predetermined operations in the semiconductor memory device, include, for example, a boosted voltage (VPP), a back bias voltage (VBB), a core voltage (VCORE) and a bit line precharge voltage (VBLP).

As described above, the semiconductor memory device adopting the discharge driving method of the fourth embodiment can prevent an area of the semiconductor memory device from being increased because the banks BANK1, BANK2, BANK3 and BANK4 share the common discharge level detector 800, which occupies a relatively large area in the semiconductor memory device.

In addition, even if the banks BANK1, BANK2, BANK3 and BANK4 are simultaneously enabled, the voltage level of the internal voltage terminal is not duplicately detected, thus preventing an unnecessary current consumption.

As described above, in accordance with the invention, a plurality of banks share a voltage detection circuit configured to detect a voltage level of an internal voltage terminal, making it possible to prevent an area of a semiconductor memory device from being increased.

Furthermore, the voltage level of the internal voltage terminal is not duplicately detected even though a plurality of banks are simultaneously activated, thus preventing current from being unnecessarily consumed.

While the invention has been described with respect to the specific embodiments, it will be apparent to those skilled in the art that various changes and modifications may be made without departing from the spirit and scope of the invention as defined in the following claims.

For example, although number of banks is four in the aforesaid first to fourth embodiments, it may be more than 4, e.g., 8, 16, or 32 or it may be less than 4, e.g., 2 or 1.

Although the common discharge level detector operates in response to the overdriving pulses in the first and second embodiment, the common discharge level detector may operate using a test signal, for example, a mode register setting (MRS) signal, which is intentionally creased by a designer.

Furthermore, logic gates and transistors exemplarily illustrated in the aforesaid embodiments may change their locations and kinds depending on polarities of signals.

What is claimed is:

1. A semiconductor memory device, comprising:
   a plurality of banks;
   a common discharge level detector configured to detect a voltage level of internal voltage terminals on the basis of a first target level in response to active signals corresponding to the respective banks; and
   a plurality of discharge drivers respectively assigned to the banks, and configured to drive the internal voltage terminals to be discharged in response to the respective active signals and respective discharge control signals outputted from the common discharge level detector.

2. The semiconductor memory device as recited in claim 1, further comprising:
   a plurality of charge level detectors respectively assigned to the banks, and configured to detect a voltage level of the internal voltage terminals on the basis of a second target level in response to the respective active signals; and
   a plurality of charge drivers respectively assigned to the banks, and configured to drive the internal voltage terminals to be charged in response to the respective active signals and respective charge control signals outputted from the plurality of charge level detectors.

3. The semiconductor memory device as recited in claim 1, wherein the common discharge level detector includes:
   a voltage divider configured to divide the voltage level of the internal voltage terminals by a predetermined ratio to generate a division voltage;
   a voltage comparator configured to compare a level of the division voltage with a level of a reference voltage corresponding to the first target level in response to an enable signal inputted as a bias; and
   an enable signal logic determiner configured to determine a logic level of the enable signal in response to the active signals.

4. The semiconductor memory device as recited in claim 3, wherein the voltage divider includes first and second resistors connected in series between the internal voltage terminals and a ground voltage terminal, and outputs the division voltage through a connection node between the first and second resistors.

5. The semiconductor memory device as recited in claim 3, wherein the voltage comparator includes:
   a first NMOS transistor having a gate receiving the division voltage, a drain connected to a driving node and a source connected to a common node, and configured to control amount of current flowing between the driving node and the common node in response to a level of the division voltage;
   a second NMOS transistor having a gate receiving the reference voltage, a drain connected to an output node and a source connected to the common node, and configured to control amount of current flowing between the output node and the common node in response to a level of the reference voltage;
   first and second PMOS transistors connected to each other in a current mirror configuration between the driving node and the output node, and configured to control amount of current flowing through the driving node and the output node to be equal to each other; and
   a third NMOS transistor having a gate receiving the enable signal, a drain connected to the common node and a source connected to a ground voltage terminal, and configured to be turned on in response to a logic level of the enable signal.

6. The semiconductor memory device as recited in claim 3, wherein the enable signal logic determiner includes:
   a NOR gate configured to perform a NOR operation on the active signals; and
   an inverter configured to receive an output signal of the NOR gate to output the enable signal.

7. The semiconductor memory device as recited in claim 1, wherein each of the discharge drivers includes:
   a selector configured to selectively apply the discharge control signal inputted via an input terminal to an output terminal in response to the active signal; and
   a driver configured to drive the internal voltage terminal to be discharged with a variable driving force in response to the applied discharge control signal selectively outputted through the output terminal.

8. The semiconductor memory device as recited in claim 7, wherein the selector includes:
   an inverter configured to receive the active signal to output an active inversion signal; and
   a pass gate configured to selectively apply the discharge control signal applied to the input terminal to the output terminal in response to the active signal and the active inversion signal.

9. The semiconductor memory device as recited in claim 8, wherein the driver includes an NMOS transistor having a gate receiving an output signal of the pass gate, a drain connected to the internal voltage terminal, and a source connected to a ground voltage terminal.

10. A semiconductor memory device, comprising:
    a plurality of banks, each including a bit line sense amplifier configured to sense and amplify data carried on a bit line, and power line driver configured to drive a power line of the bit line sense amplifier with an overdriving voltage or a core voltage inputted through core voltage terminals;
    an overdriving pulse generator configured to generate a plurality of overdriving pulses for controlling overdriving operation of each of the banks in response to active signals corresponding to each of the banks;
    a common discharge level detector configured to detect a voltage level of the core voltage terminals on the basis of a first target level in response to the overdriving pulses corresponding to the respective banks; and
    a plurality of discharge drivers respectively assigned to the banks, and configured to drive the core voltage terminals to be discharged in response to the respective overdriving pulses and respective discharge control signals outputted from the common discharge level detector.

11. The semiconductor memory device as recited in claim 10, further comprising:
    a plurality of charge level detectors respectively assigned to the banks, and configured to detect a voltage level of the core voltage terminals on the basis of a second target level in response to the respective active signals; and
    a plurality of charge drivers respectively assigned to the banks, and configured to drive the core voltage terminals to be charged in response to the respective active signals and respective charge control signals outputted from the plurality of charge level detectors.

12. The semiconductor memory device as recited in claim 10, wherein the common discharge level detector includes:
    a voltage divider configured to divide the voltage level of the core voltage terminals by a predetermined ratio to generate a division voltage;
    a voltage comparator configured to compare a level of the division voltage with a level of a reference voltage corresponding to the first target level in response to an enable signal inputted as a bias;
a pulse delay configured to delay the overdriving pulses by predetermined delay times to generate a plurality of delay pulses; and
an enable signal logic determiner configured to determine a logic level of the enable signal in response to the delay pulses.

13. The semiconductor memory device as recited in claim 12, wherein the voltage divider includes first and second resistors connected in series between the core voltage terminals and a ground voltage terminal, and outputs the division voltage through a connection node between the first and second resistors.

14. The semiconductor memory device as recited in claim 12, wherein the voltage comparator includes:
a first NMOS transistor having a gate receiving the division voltage, a drain connected to a driving node and a source connected to a common node, and configured to control amount of current flowing between the driving node and the common node in response to a level of the division voltage;
a second NMOS transistor having a gate receiving the reference voltage, a drain connected to an output node and a source connected to the common node, and configured to control amount of current flowing between the output node and the common node in response to a level of the reference voltage;
first and second PMOS transistors connected to each other in a current mirror configuration between the driving node and the output node, and configured to control amount of current flowing through the driving node and the output node to be equal to each other; and
a third NMOS transistor having a gate receiving the enable signal, a drain connected to the common node and a source connected to a ground voltage terminal, and configured to be turned on in response to a logic level of the enable signal.

15. The semiconductor memory device as recited in claim 12, wherein the enable signal logic determiner includes:
a NOR gate configured to perform a NOR operation on the delay pulses; and
an inverter configured to receive an output signal of the NOR gate to output the enable signal.

16. The semiconductor memory device as recited in claim 12, wherein each of the discharge drivers includes:
a selector configured to selectively apply the discharge control signal inputted via an input terminal to an output terminal in response to the delay pulse; and
a driver configured to drive the core voltage terminal to be discharged with a variable driving force in response to the applied discharge control signal selectively outputted through the output terminal.

17. The semiconductor memory device as recited in claim 16, wherein the selector includes:
an inverter configured to receive the delay pulse to output an delay inversion pulse; and
a pass gate configured to selectively apply the discharge control signal applied to the input terminal to the output terminal in response to the delay pulse and the delay inversion pulse.

18. The semiconductor memory device as recited in claim 17, wherein the driver includes an NMOS transistor having a gate receiving an output signal of the pass gate, a drain connected to the core voltage terminal, and a source connected to a ground voltage terminal.

19. A semiconductor memory device, comprising:
a plurality of banks;
a common discharge level detector configured to detect a voltage level of internal voltage terminals on the basis of a first target level in response to active signals corresponding to the respective banks;
a common charge level detector configured to detect a voltage level of the internal voltage terminals on the basis of a second target level in response to the active signals;
a plurality of discharge drivers respectively assigned to the banks, and configured to drive the internal voltage terminals to be discharged in response to the respective active signals and respective discharge control signals outputted from the common discharge level detector; and
a plurality of charge drivers respectively assigned to the banks, and configured to drive the internal voltage terminals to be charged in response to the respective active signals and respective charge control signals outputted from the common charge level detector.

20. The semiconductor memory device as recited in claim 19, wherein the common discharge level detector includes:
a voltage divider configured to divide the voltage level of the internal voltage terminals by a predetermined ratio to generate a division voltage;
a voltage comparator configured to compare a level of the division voltage with a level of a reference voltage corresponding to the first target level in response to an enable signal inputted as a bias; and
an enable signal logic determiner configured to determine a logic level of the enable signal in response to the active signals.

21. The semiconductor memory device as recited in claim 20, wherein the voltage comparator includes:
a first NMOS transistor having a gate receiving the division voltage, a drain connected to a driving node and a source connected to a common node, and configured to control amount of current flowing between the driving node and the common node in response to a level of the division voltage,
a second NMOS transistor having a gate receiving the reference voltage, a drain connected to an output node and a source connected to the common node, and configured to control amount of current flowing between the output node and the common node in response to a level of the reference voltage;
first and second PMOS transistors connected to each other in a current mirror configuration between the driving node and the output node, and configured to control amount of current flowing through the driving node and the output node to be equal to each other; and
a third NMOS transistor having a gate receiving the enable signal, a drain connected to the common node and a source connected to a ground voltage terminal, and configured to be turned on in response to a logic level of the enable signal.

22. The semiconductor memory device as recited in claim 19, wherein the common charge level detector includes:
a voltage divider configured to divide the voltage level of the internal voltage terminals by a predetermined ratio to generate a division voltage;
a voltage comparator configured to compare a level of the division voltage with a level of a reference voltage corresponding to the second target level in response to an enable signal inputted as a bias; and an enable signal logic determiner configured to determine a logic level of the enable signal in response to the active signals.

23. The semiconductor memory device as recited in claim 20, wherein the voltage divider includes first and second resistors connected in series between the internal voltage terminals and a ground voltage terminal, and outputs the division voltage through a connection node between the first and second resistors.

24. The semiconductor memory device as recited in claim 20, wherein the enable signal logic determiner includes
a NOR gate configured to perform a NOR operation on the active signals; and
an inverter configured to receive an output signal of the NOR gate to output the enable signal.

25. The semiconductor memory device as recited in claim 22, wherein the voltage comparator includes:
a first NMOS transistor having a gate receiving the division voltage, a drain connected to a driving node and a source connected to a common node, and configured to control amount of current flowing between the driving node and the common node in response to a level of the division voltage;
a second NMOS transistor having a gate receiving the reference voltage, a drain connected to an output node and a source connected to the common node, and configured to control amount of current flowing between the output node and the common node in response to a level of the reference voltage;
first and second PMOS transistors connected to each other in a current mirror configuration between the driving node and the output node, and configured to control amount of current flowing through the driving node and the output node to be equal to each other; and
a third NMOS transistor having a gate receiving the enable signal, a drain connected to the common node and a source connected to a ground voltage terminal, and configured to be turned on in response to a logic level of the enable signal.

26. The semiconductor memory device as recited in claim 19, wherein each of the discharge drivers includes:
a selector configured to selectively apply the discharge control signal inputted via an input terminal to an output terminal in response to the active signal; and
a driver configured to drive the internal voltage terminal to be discharged with a variable driving force in response to the applied discharge control signal selectively outputted through the output terminal.

27. The semiconductor memory device as recited in claim 26, wherein the selector includes:
an inverter configured to receive the active signal to output an active inversion signal; and
a pass gate configured to selectively apply the discharge control signal applied to the input terminal to the output terminal in response to the active signal and the active inversion signal.

28. The semiconductor memory device as recited in claim 27, wherein the driver includes an NMOS transistor having a gate receiving an output signal of the pass gate, a drain connected to the internal voltage terminal, and a source connected to a ground voltage terminal.

29. The semiconductor memory device as recited in claim 19, wherein each of the charge drivers includes:
a selector configured to selectively apply the charge control signal inputted via an input terminal to an output terminal in response to the active signal; and
a driver configured to drive the internal voltage terminal to be charged with a variable driving force in response to the applied charge control signal selectively outputted through the output terminal.

30. The semiconductor memory device as recited in claim 29, wherein the selector includes:
an inverter configured to receive the active signal to output an active inversion signal; and
a pass gate configured to selectively apply the charge control signal applied to the input terminal to the output terminal in response to the active signal and the active inversion signal.

31. The semiconductor memory device as recited in claim 30, wherein the driver includes a PMOS transistor having a gate receiving an output signal of the pass gate, a source connected to a power supply voltage terminal, and a drain connected to the internal voltage terminal.

32. A semiconductor memory device, comprising:
a plurality of banks, each including a bit line sense amplifier configured to sense and amplify data carried on a bit line, and a power line driver configured to drive a power line of the bit line sense amplifier with an overdriving voltage or a core voltage inputted through core voltage terminals;
an overdriving pulse generator configured to generate a plurality of overdriving pulses for controlling overdriving operation of each of the banks in response to active signals corresponding to each of the banks;
a common discharge level detector configured to detect a voltage level of the core voltage terminals on the basis of a first target level in response to the overdriving pulses corresponding to the respective banks;
a common charge level detector configured to detect a voltage level of the core voltage terminals on the basis of a second target level in response to the active signals;
a plurality of discharge drivers respectively assigned to the banks, and configured to drive the core voltage terminals to be discharged in response to the respective overdriving pulses and respective discharge control signals outputted from the common discharge level detector; and
a plurality of charge drivers respectively assigned to the banks, and configured to drive the core voltage terminals to be charged in response to the respective active signals and respective charge control signals outputted from the common charge level detector.

33. The semiconductor memory device as recited in claim 32, wherein the common discharge level detector includes:
a voltage divider configured to divide the voltage level of the core voltage terminals by a predetermined ratio to generate a division voltage;
a voltage comparator configured to compare a level of the division voltage with a level of a reference voltage corresponding to the first target level in response to an enable signal inputted as a bias;
a pulse delay configured to delay the overdriving pulses by predetermined delay times to generate a plurality of delay pulses; and
an enable signal logic determiner configured to determine a logic level of the enable signal in response to the delay pulses.

34. The semiconductor memory device as recited in claim 33, wherein the voltage comparator includes:
a first NMOS transistor having a gate receiving the division voltage, a drain connected to a driving node and a source connected to a common node, and configured to control amount of current flowing between the driving node and the common node in response to a level of the division voltage;

a second NMOS transistor having a gate receiving the reference voltage, a drain connected to an output node and a source connected to the common node, and configured to control amount of current flowing between the output node and the common node in response to a level of the reference voltage;

first and second PMOS transistors connected to each other in a current mirror configuration between the driving node and the output node, and configured to control amount of current flowing through the driving node and the output node to be equal to each other; and a third NMOS transistor having a gate receiving the enable signal, a drain connected to the common node and a source connected to a ground voltage terminal, and configured to be turned on in response to a logic level of the enable signal.

35. The semiconductor memory device as recited in claim 33, wherein the voltage divider includes first and second resistors connected in series between the core voltage terminals and a ground voltage terminal, and outputs the division voltage through a connection node between the first and second resistors.

36. The semiconductor memory device as recited in claim 33, wherein the enable signal logic determiner includes:
   a NOR gate configured to perform a NOR operation on the delay pulses; and
   an inverter configured to receive an output signal of the NOR gate to output the enable signal.

37. The semiconductor memory device as recited in claim 32, wherein each of the discharge drivers includes:
   a selector configured to selectively apply the discharge control signal inputted via an input terminal to an output terminal in response to the delay pulse; and
   a driver configured to drive the core voltage terminal to be discharged with a variable driving force in response to the applied discharge control signal selectively outputted through the output terminal.

38. The semiconductor memory device as recited in claim 37, wherein the selector includes:
   an inverter configured to receive the delay pulse to output an delay inversion pulse; and
   a pass gate configured to selectively apply the discharge control signal applied to the input terminal to the output terminal in response to the delay pulse and the delay inversion pulse.

39. The semiconductor memory device as recited in claim 32, wherein the common charge level detector includes:
   a voltage divider configured to divide the voltage level of the core voltage terminals by a predetermined ratio to generate a division voltage;
   a voltage comparator configured to compare a level of the division voltage with a level of a reference voltage corresponding to the second target level in response to an enable signal inputted as a bias; and
   an enable signal logic determiner configured to determine a logic level of the enable signal in response to the active signals.

40. The semiconductor memory device as recited in claim 39, wherein the voltage comparator includes:
   a first NMOS transistor having a gate receiving the division voltage, a drain connected to a driving node and a source connected to a common node, and configured to control amount of current flowing between the driving node and the common node in response to a level of the division voltage;
   a second NMOS transistor having a gate receiving the reference voltage, a drain connected to an output node and a source connected to the common node, and configured to control amount of current flowing between the output node and the common node in response to a level of the reference voltage;
   first and second PMOS transistors connected to each other in a current mirror configuration between the driving node and the output node, and configured to control amount of current flowing through the driving node and the output node to be equal to each other; and
   a third NMOS transistor having a gate receiving the enable signal, a drain connected to the common node and a source connected to a ground voltage terminal, and configured to be turned on in response to a logic level of the enable signal.

41. The semiconductor memory device as recited in claim 39, wherein the voltage divider includes first and second resistors connected in series between the core voltage terminals and a ground voltage terminal, and outputs the division voltage through a connection node between the first and second resistors.

42. The semiconductor memory device as recited in claim 39, wherein the enable signal logic determiner includes:
   a NOR gate configured to perform a NOR operation on the active signals; and
   an inverter configured to receive an output signal of the NOR gate to output the enable signal.

43. The semiconductor memory device as recited in claim 42, wherein the driver includes an NMOS transistor having a gate receiving an output signal of the pass gate, a drain connected to the core voltage terminal, and a source connected to a ground voltage terminal.

44. The semiconductor memory device as recited in claim 32, wherein each of the charge drivers includes:
   a selector configured to selectively apply the charge control signal inputted via an input terminal to an output terminal in response to the active signal; and
   a driver configured to drive the core voltage terminal to be charged with a variable driving force in response to the applied charge control signal selectively outputted through the output terminal.

45. The semiconductor memory device as recited in claim 44, wherein the selector includes:
   an inverter configured to receive the active signal to output an active inversion signal; and
   a pass gate configured to selectively apply the charge control signal applied to the input terminal to the output terminal in response to the active signal and the active inversion signal.

46. The semiconductor memory device as recited in claim 45, wherein the driver includes a PMOS transistor having a gate receiving an output signal of the pass gate, a source connected to a power supply voltage terminal, and a drain connected to the core voltage terminal.

* * * * *